(12) United States Patent
Blumenthal et al.

(10) Patent No.: US 9,722,705 B2
(45) Date of Patent: Aug. 1, 2017

(54) METHOD AND APPARATUS FOR CONTROLLING, MONITORING, AND COMMUNICATING WITH TUNABLE OPTICAL DEVICES AND SUBASSEMBLIES

(71) Applicant: OE SOLUTIONS AMERICA, INC., Englewood Cliffs, NJ (US)

(72) Inventors: Daniel J. Blumenthal, Englewood Cliffs, NJ (US); Holger Klein, Englewood Cliffs, NJ (US); Todd Cicchi, Englewood Cliffs, NJ (US); Patrick Bybee, Englewood Cliffs, NJ (US); Henrik Poulsen, Englewood Cliffs, NJ (US)

(73) Assignee: OE SOLUTIONS AMERICA, INC., Ridgefield Park, NJ (US)

( * ) Notice: Subject to any disclaimer, the term of this patent is extended or adjusted under 35 U.S.C. 154(b) by 0 days.

(21) Appl. No.: 14/947,905

(22) Filed: Nov. 20, 2015

(65) Prior Publication Data
US 2016/0254866 A1 Sep. 1, 2016

Related U.S. Application Data

(60) Provisional application No. 62/082,545, filed on Nov. 20, 2014.

(51) Int. Cl.
*H04B 10/00* (2013.01)
*H04B 10/50* (2013.01)
(Continued)

(52) U.S. Cl.
CPC ....... *H04B 10/5057* (2013.01); *H01S 5/0687* (2013.01); *H04B 10/503* (2013.01);
(Continued)

(58) Field of Classification Search
CPC .............. H04B 10/5057; H04B 10/503; H04B 10/572; H01S 5/06; H01S 5/0687;
(Continued)

(56) References Cited

U.S. PATENT DOCUMENTS 6,496,619 B2* 12/2002 Naganuma ......... G02B 6/29391
359/342
6,631,146 B2* 10/2003 Pontis ..................... H01S 5/141
372/20
(Continued)

FOREIGN PATENT DOCUMENTS

| WO | 2014014846 | 1/2014 |
|---|---|---|
| WO | 2014107537 | 7/2014 |

OTHER PUBLICATIONS

"Control of Widely Tunable SSG-DBR Lasers for Dense Wavelenght Division Multiplexing", by Gert Sarlet, et al., vol. 18, No. 8, Aug. 2000, pp. 1128-1138.
(Continued)

*Primary Examiner* — Hibret Woldekidan
(74) *Attorney, Agent, or Firm* — Ichthus International Law, PLLC

(57) ABSTRACT

An apparatus for controlling, monitoring, and communicating with an optical device, photonic integrated circuit or subassembly is provided. The apparatus includes an optical device or subassembly; and afield programmable device including programmable hardware gates coupled to the optical device or subassembly. The field programmable device may be configured to implement a plurality of functions at a gate level for controlling, monitoring, and/or communicating with the optical device or subassembly, each of the plurality of functions being configured to execute as a concurrent process, without use of a microprocessor or a microcontroller. Further, a programmable optical device, such as a programmable optical transmitter, optical subas-
(Continued)

sembly, or transceiver based on a tunable laser having field programmable device centric control systems with software-enabled features offer extensive real-time control and monitoring functionality based on for example actual traffic flows.

20 Claims, 33 Drawing Sheets

(51) Int. Cl.
   *H04B 10/572* (2013.01)
   *H01S 5/0687* (2006.01)
   *H01S 5/00* (2006.01)

(52) U.S. Cl.
   CPC ............ *H04B 10/572* (2013.01); *H01S 5/005* (2013.01); *H01S 5/0085* (2013.01)

(58) Field of Classification Search
   CPC ...... H01S 5/0014; H01S 5/0683; H01S 5/125; H01S 5/005; H01S 5/0085; H04J 14/0227; H04L 12/2602
   USPC ...... 398/182, 192–198, 164, 140; 372/29.01, 372/29.011, 20
   See application file for complete search history.

(56) References Cited

U.S. PATENT DOCUMENTS

| | | | | |
|---|---|---|---|---|
| 6,690,693 B1* | 2/2004 | Crowder | ................ | B82Y 20/00 372/29.01 |
| 6,788,719 B2* | 9/2004 | Crowder | ................ | B82Y 20/00 372/29.015 |
| 6,917,632 B2* | 7/2005 | Koller | ...................... | H01S 3/13 372/20 |
| 6,954,476 B2* | 10/2005 | Coldren | ................ | B82Y 20/00 372/29.015 |
| 7,061,943 B2* | 6/2006 | Coldren | ................ | H01S 5/0014 372/18 |
| 7,622,952 B1* | 11/2009 | Lim | .......................... | G06F 1/10 326/39 |
| 8,036,540 B2* | 10/2011 | Ichino | .................. | H04B 10/572 372/38.01 |
| 8,644,713 B2 | 2/2014 | Poulsen et al. | | |
| 8,964,806 B2* | 2/2015 | Ensher | ................ | H01S 5/06256 372/20 |
| 9,438,347 B2* | 9/2016 | Conger | .................. | H04B 10/40 |
| 9,467,229 B2* | 10/2016 | Kai | ..................... | H04B 10/2575 |
| 9,485,021 B2* | 11/2016 | Bujanos | ........... | H04B 10/07955 |
| 9,543,737 B2* | 1/2017 | Blumenthal | .......... | H01S 5/0683 |
| 2004/0120372 A1 | 6/2004 | Simsarian et al. | | |
| 2004/0126057 A1* | 7/2004 | Yoo | ........................ | B82Y 20/00 385/16 |
| 2005/0100065 A1 | 5/2005 | Coldren et al. | | |
| 2006/0072634 A1 | 4/2006 | Daiber | | |
| 2011/0116792 A1 | 5/2011 | Blumenthal et al. | | |
| 2013/0243015 A1 | 9/2013 | Eriksson et al. | | |
| 2014/0147130 A1 | 5/2014 | Poulsen et al. | | |
| 2014/0236527 A1* | 8/2014 | Chan | ................ | G01R 31/31830 702/119 |
| 2015/0333475 A1 | 11/2015 | Blumenthal | | |
| 2015/0365177 A1 | 12/2015 | Blumenthal et al. | | |

OTHER PUBLICATIONS

International Search Report and Written Opinion, mailed Mar. 16, 2016.
"An FPGA-Based Optical Transformer Design Using Real-Time DSP for Advanced Signal Formats and Electronic Predistortion", by Watts P. et al., Journal of LIghtwave Technology, IEEE Service Cneter, New York, NY, vol. 25, No. 10, pp. 3089-3099.
"Design of Digital Pound-Drever-Hall Frequency Stabilizing System for Two-Cavity Dual-Frequency Nd: YAG:laser". By King, Junhong, et al., Eighth Int'l. Symposium on Precision Engineering Measurement and Instrumentation, Proceedings of SPIE, vol. 8759, 875941.

\* cited by examiner

FIG. 9A

FIG. 10A where:
W0 = the laser center wavelength
Wn = a representative unwanted frequency component
ΔW = Wn − W0
Ω = the modulation phase
J0, J1(m) = Bessel functions values at the modulation frequency
V0 = the modulation amplitude
g = resonator coupling coefficient
Q0 = the resonator Q at W0 (finesse in the case of a Fabry Perot etalon)
R0 = detector circuit impedance at W0.

FPGA Discrete Time Domain PID Loop

Symbolic Model of the Boxcar Filter

Bytes  - Wavelength Control
[00,01] - Laser Cavity Phase
[02,03] - Back Mirror
[04,05] - Gain
[06,07] - Gain 2
[08,09] - Front Mirror
[10,11] - SOA1
[12,13] - SOA2
[14,15] - MZM 1 Bias Voltage
[16,17] - MZM 2 Bias Voltage
[18,19] - MZM 1 Drive Voltage
[20,21] - MZM 2 Drive Voltage
[22,23] - MZM Delay Control
[22,23] - Phase1
[24,25] - Phase2
[26,27] - Available for future use
[28,29] - Available for future use
[30,31] - Available for future use

METHOD AND APPARATUS FOR CONTROLLING, MONITORING, AND COMMUNICATING WITH TUNABLE OPTICAL DEVICES AND SUBASSEMBLIES

CLAIM OF PRIORITY UNDER 35 U.S.C. §119

This patent application claims benefit of U.S. Provisional Patent Application Ser. No. 62/082,545 filed on Nov. 20, 2014, titled "Methods and Apparatus for Controlling Tunable Optical Devices and Subassemblies," the entire disclosure of which is incorporated herein by reference in its entirety.

BACKGROUND

Today's fiber optic based networks use transceivers as the interface between electronics and optical signals that propagate on the optical fiber and at other points in the network where information is converted between electronic form and optical form.

Optical devices, including optical, photonic and optoelectronic devices and components are used to transmit, code, receive, and decode optical data for transmission on an optical fiber. The optical devices are interfaced to a variety of electronic circuits which are used to control the devices and components, as well as interface data in electronic form on the transmit and receive side, code and decode electronic data, perform other functions like clock recovery and error correction and realize functions required to control an environment of the circuitry including temperature, wavelength and other tunable laser functions and functions of the interface optics and circuits that are used to realize a fully operational tunable laser and tunable subassembly.

Programmable optical devices, such as transmitters, optical subassemblies, and transceivers, based on a tunable laser, require many control systems to support the functions of the tunable laser and support the control, monitoring and communications functionality. A widely tunable laser includes multiple sections, generally including a gain section, a tunable phase section, and tunable mirror sections and in some designs a tunable filter section is also incorporated. Tuning the physical parameters of these sections results in tuning of an output laser wavelength. Other parameters of the tunable laser include an optical data modulator, if it is integrated or not integrated, and other functions like power control, wavelength locking, linewidth narrowing and control, modulation control, higher order modulation, or the like, performance of which may be enhanced using the present disclosure.

Examples of prior art references may include "Control of Widely Tunable SSG-DBR Lasers for Dense Wavelength Division Multiplexing," *Journal of Lightwave Technology*, vol. 18, No. 8, August 2000; U.S. Pat. Nos. 6,954,476; 6,788,719; 6,690,693; and U.S. Pat. App. No. 2004/0120372, the entire disclosures of which are incorporated herein by reference in their entirety.

Known prior art programmable wavelength tunable transmitters, such as transmitter optical subsystem assembly (TOSA), transceivers and other communications optical subassemblies, however, are not programmable in real-time and thus lack flexibility and responsiveness at the optical layer. Further, as the existing devices lack real time programmability, there is a high cost associated with planning, building, operating and maintaining data center networks.

SUMMARY

It is to be understood that both the foregoing general description and the following detailed description are exemplary, and are intended to provide further explanation of the present technology or disclosure as described.

The present disclosure relates generally to optical devices and subassemblies, such as optical transceivers, modules and subassemblies as well as laser transmitters and receivers that employ integrated electronics and photonic integrated circuits and combinations thereof. The optical devices and subassemblies contain multiple elements, for example, widely tunable semiconductor lasers integrated on the same substrate with optical modulators and semiconductor optical amplifiers, non-integrated optical and optoelectronic elements, and other measurement and control devices and elements.

In an aspect, an apparatus for controlling, monitoring, and communicating with an optical device, photonic integrated circuit or subassembly for optical communications is provided. The apparatus includes an optical device or subassembly and a field programmable device including programmable hardware gates coupled to the optical device or subassembly. The field programmable device is configured to implement a plurality of functions at a gate level for controlling, monitoring, and/or communicating with the optical device or subassembly, each of the plurality of functions being configured to execute as a concurrent process, without use of a microprocessor or a microcontroller.

In an aspect of the present disclosure, an optical communication system includes an optical device or subassembly comprising a tunable laser integrated on a same substrate with an optical modulator and a semiconductor optical amplifier, non-integrated optical and optoelectronic elements; and a field programmable device including programmable hardware gates coupled to the optical device or subassembly and the laser transmitter and receiver. The field programmable device is configured to implement a plurality of functions at a gate level for controlling, monitoring, and/or communicating with the optical device or subassembly, each of the plurality of functions being configured to run as a concurrent process, without use of a microprocessor or a microcontroller. The field programmable device of the optical communication system comprises one or more field programmable gate arrays (FPGAs) or programmable logic devices (PLDs). Further, the field programmable device of the optical communication system may be configured to comprise application programmable interfaces (APIs) for real-time control and monitoring of the optical device and subassembly based on actual traffic flows. Also, the plurality of functions may be configured to run at different clock signals in the field programmable device. Further, the field programmable device may comprise a communication interface including one or both of sockets to a graphical user interface (GUI) or an application programming interface (API) that allows control, monitoring and/or communication with the tunable laser integrated on the same substrate with the optical modulator and the semiconductor optical amplifier, non-integrated optical and optoelectronic elements.

In another aspect, the present disclosure comprises real-time programmable optical devices and subassemblies, such as wavelength tunable transmitters (e.g., TOSA), transceivers, and other communications optical subassemblies. According to the present disclosure, software-enabled features, accessible via application programmable interfaces (APIs), offer extensive real-time control and monitoring of the optical devices and subassemblies based on, for example, actual traffic flows. Programmability enables an unprecedented level of flexibility and responsiveness at the optical layer with real-time scaling and rerouting of bandwidth, higher bandwidth extraction from a given fiber plant as well as a reduction in complexity and related cost of planning, building, operating and maintaining data center networks.

In an aspect of the present disclosure, programmable systems, methods and devices are provided to control, monitor and communicate with tunable lasers, tunable transmitters, tunable transceiver pluggables and subassemblies, and board mounted tunable transceivers and the auxiliary integrated or non-integrated optics, optoelectronics and/or electronics. The systems, methods and devices described herein realize functions to design, build, produce and manufacture a fully functional tunable laser, tunable transmitter, tunable transceiver, pluggable, subassembly or board mount. The present disclosure implements monitoring and control and communications functions for the tunable laser, transceiver, module or optical subassembly in a field programmable device including a field programmable gate array (FPGA) or programmable logic device (PLD) circuitry architecture, or in combination with a microprocessor or microcontroller.

Both the FPGA and PLD circuitry are reconfigurable circuitry, which can be programmed/re-programmed in the field and/or real-time after manufacture. According to the present disclosure, the control functions of the optical device or subassembly can be implemented without a microcontroller or microprocessor. For example, various functions including control functions may be embedded in the FPGA or PLD. By way of example, the functions that are embedded in the FPGA or PLD include, but are not limited to, soft state machines, electronic filters, control and feedback loops, decisions circuits, communications interfaces, etc., which are implemented by embedding concurrent processes in the FPGA, the PLD or the combination of programmable logic and microprocessor. The present disclosure is an advance over existing technologies that utilize microprocessors or microcontrollers for control and programmable logic devices such as FPGAs or PLDs to store calibration and other data for lookup operation(s).

Other advantages of the present disclosure are described in further detail below. By way of example, the control, monitoring and communications functions to build and operate a tunable transmitter, tunable laser, tunable transceiver, pluggable or subassembly may be programmed in hardware gates in the FPGA, using firmware, each running at their own clock speed and implemented modularly. The concurrency, modularity, ability to run processes at different clock speeds, may result in advances over the existing technology for reduced costs, complexity, power consumption, and other advantages.

The present disclosure includes, but is not limited to, the control, monitor and communications method and apparatus for a tunable laser/transceiver which is programmable and firmware updatable, and may be fully FPGA controlled (no microprocessor or microcontroller required). Embodiments of the present disclosure may include, but are not limited to:
  Communications interfaces to/from a client or host or fiber communications channel;
  Tunable laser wavelength memory and management;
  Programmable read only memory (PROM)-serial peripheral interface (SPI) FLASH interface to external erasable programmable read-only memory (EPROM);
  Set currents and voltages for all control and monitoring functions for the tunable laser, modulator, optoelectronics, electronics, sensors and other control and monitor points that interface via voltages and currents;
  Optical and electronic and photonic integrated circuit (PIC) monitors;
  Boxcar averagers and other signal processing functions;
  Automatic optical power control;
  Wavelength locking;
  Linewidth narrowing algorithms and circuits (e.g., Pound Dreyer Hall (PDH));
  Temperature monitoring and control;
  Alarm and monitoring control and communications;
  Application programmable interfaces (APIs); and
  Fully calibrated stand-alone, ready for integration into pluggables or on-board—digital control/monitoring/data—onboard calibrated EPROM.

According to an aspect of the present disclosure, control systems and methods are provided to rapidly control an optical device and/or subassembly. The control systems and methods comprise functionality to control elements of the optical device or subassembly, such as a tunable laser, internal and external optical and optoelectronic monitoring and control functions, internal and external electronic monitoring and control functions, signal processing functions, and associated functions in a transceiver, optical module and/or optical subassembly.

According to another aspect of the present disclosure is an implementation of the embodiments of the control systems and methods according to the present disclosure in a field programmable device, such as a FPGA, PLD, or the like, either stand alone or in combination with a microcontroller, and/or in combination with analog to digital converting (ADC) and digital to analog converting (DAC) circuits, where the FPGA, PLD, or the like is used for the control functions as part of the first embodiment, beyond the simple present day use of FPGAs and PLDs as data storage only mechanisms, for example, lookup tables for tunable lasers. This embodiment of the present disclosure thus provides various advantageous over the existing technology, which utilizes FPGAs and/or PLDs in a limited capacity to store data about tunable lasers and other embodiments to be accessed by other processing modules for monitoring, control and processing, but not for the control systems and methods as described herein.

In an aspect of the present disclosure, the field programmable device may be configured to automatically adapt laser control currents of a tunable laser to measured temperature so as to reduce a load on a thermoelectric cooler (TEC), based on the measured temperature and at least one of: by moving between tables stored in the field programmable device or by extrapolating between temperature wavelength maps.

An advantage of using the field programmable device, such as the FPGA, PLD, or the like, as part of the control systems and methods according to the present disclosure is that code and processes may be modular and/or concurrent processes, each may run at different, unique clocks speeds within the same device and is reprogrammable, and can handle all control, monitoring, and communication embodiments. Accordingly, in an aspect of the present disclosure, one or more submodules of the system can be replaced, modified, programmed, and/or re-programmed without affecting other modules/submodules. As such, advantages of running the control, monitoring, and communications systems of the optical devices and subassemblies in a programmable manner at a gate level may include lower power consumption, lower cost, wider use across broader classes of applications, and introduction of new control modules of a variety of types (filter, analog circuits, state machines, etc.) in a common programmable architecture.

According to another of the present disclosure, the methods and systems described herein may be utilized with a multi-facet laser architecture, as described in U.S. patent application Ser. No. 14/146,717, published on Jul. 10, 2014 as WO2014/107537, which is incorporated herein by reference in its entirety. As described in WO2014/107537, two or more facet of a tunable laser may be used for an output and may be connected to a novel modulator structure. The control and monitoring described in the present disclosure, in certain forms, may have additional advantages over prior state of the art when combined with the inventions described in WO2014/107537.

According to an aspect, the present disclosure may be employed with optical devices and subassemblies that use an FPGA centric architecture. Examples of devices and subassemblies may include U.S. Pat. No. 8,644,713, and U.S. patent application Ser. No. 14/171,480, titled "Programmable Optical Subassemblies and Modules"; Ser. No. 12/945,470, titled "Optical Network Interface Module Using A Hardware Programmable Optical Network"; and Ser. No. 13/942,519, titled "Control Systems for Optical Devices and Subassemblies," which are incorporated herein by reference in their entirety. The FPGA centric architecture may run all control, monitoring, communications, algorithms using an internal FPGA without use of a microprocessor or microcontroller in these optical devices and subassemblies.

According to the present disclosure, the same firmware for an external FPGA may also be used to calibrate the laser and significantly speed up the calibration speed, where the resulting calibration data is then ported to a wavelength control FPGA which is used to control the tunable laser, making the calibration during manufacturing and the control and re-calibration or re-programming uniform with FPGA technology and firmware across all embodiments of the use of a tunable laser from manufacturing to deployment in a network. As such, the present technology may significantly cut down on the cost of manufacturing and ownership as well as improving performance.

According to another aspect of the present disclosure, a communications interface may be integrated into the field programmable device (e.g., FPGA) as described in U.S. patent application Ser. No. 12/945,470, which is incorporated herein by reference in its entirety, as well as associated patents and patent applications. The communications interface may comprise sockets to graphical users interfaces (GUIs) and/or application programmable interfaces (API) that allow software control, monitoring and calibration of a complete tunable laser using a software layer that interacts with the tunable laser through the field programmable device (e.g. FPGA or PLD or the like) to implement one of any of the fast wavelength calibration algorithms, making the ease of use, manufacturability, speed of calibration, and integration into other manufacturing, system integration and network operation systems enabled and significantly lower cost and flexible compared to any existing approach. The speed of the calibration routines, on the order of minutes, may even allow recalibration in the field or real-time using the application layer interfaces via the field programmable device (e.g., FPGA, PLD or the like).

In another aspect of the present disclosure, the field programmable device may be configured to receive one or more control signals from a GUI coupled to the field programmable device via wireless communications or from a GUI of another apparatus located at a remote site over an optical communication link.

Other significant advantages of the present disclosure may also include the ability to utilize processes embedded in the field programmable device (e.g., FPGA, PLD or the like), in addition to control and monitoring interfaces, to realize all functions needed to improve the performance of the tunable laser and transmitter using firmware, for example, narrowing a laser linewidth for coherent communications, reducing the laser relative intensity noise (RIN), as two of many examples. These processes may be run in parallel with all other processes for the tunable laser, transmitter, transceiver, module or subassembly, and in many cases can re-use hardware used for other functions.

BRIEF DESCRIPTION OF THE DRAWINGS

A more detailed understanding may be obtained from the following description in conjunction with the accompanying drawings.

DETAILED DESCRIPTION

According to the present disclosure, optical devices, such as optical transmitters, optical subassemblies, and transceivers which are programmable are described. By way of example, the programmable optical devices are based on a tunable laser having field programmable device centric (e.g., a FPGA or a PLD centric) control systems which support various functions of the tunable laser and supporting control, monitoring and communications functionality. The present disclosure comprises real-time programmable wavelength tunable transmitters, such as transmitter optical subassemblies (TOSAs), transceivers, and other communications optical subassemblies.

Figure 1A:
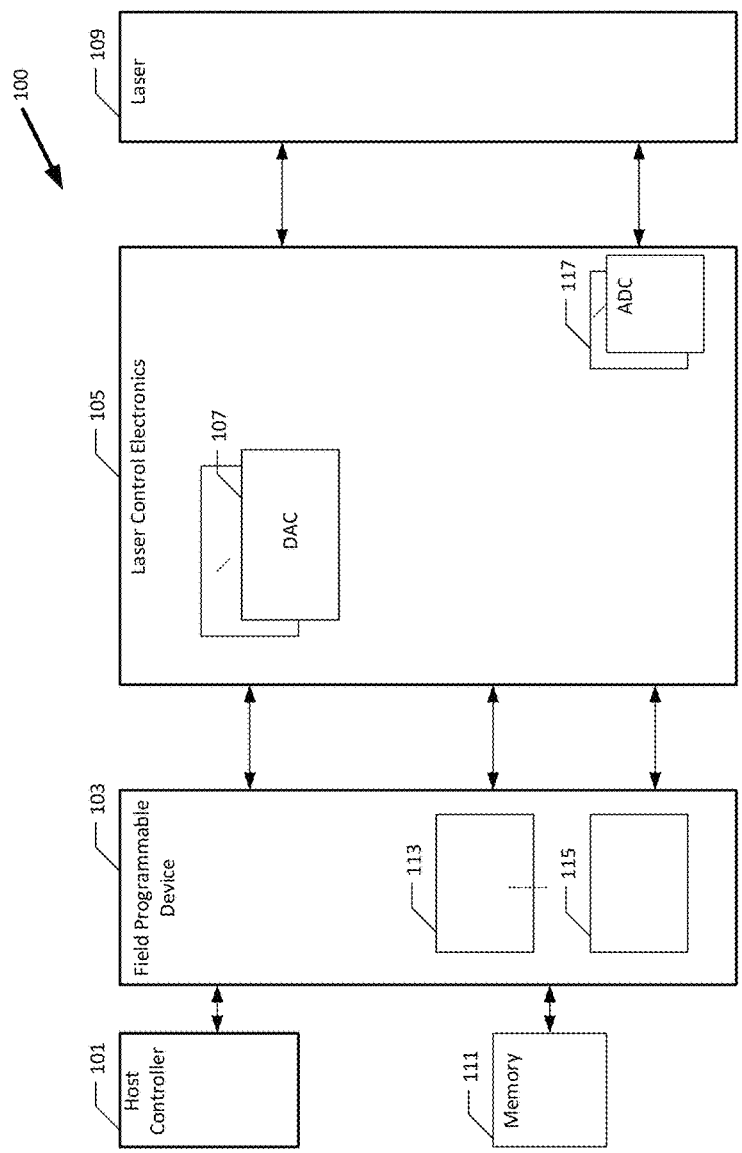
FIG. 1A illustrates a block diagram conceptually showing components for a field programmable device centric control system in accordance with an aspect of the present disclosure.

FIG. 1A illustrates a block diagram conceptually showing components for a field programmable device centric (e.g., FPGA/PLD centric) control system. A system 100 shown in FIG. 1 includes a host controller 101, a field programmable device 103 (e.g., FPGA, PLD or the like), laser control electronics 105, a tunable laser 109, and a storage 111. The host controller 101 may be configured to communicate with the field programmable device 103 for various functions, and also configured to receive data relating to operation of the tunable laser 109. In the example, the field programmable device 103 may drive the laser control electrodes 105 through digital-to-analog converters (DACs) 107 interfaced to the field programmable device 103 and the tunable laser 109. Further, the field programmable device 103 may be coupled to the tunable laser 109 through analog-to-digital converters (ADCs) 117 for communications and control of the tunable laser 109.

Further, the field programmable device 103 may also include various components, modules or processes (which are not shown in FIG. 1A, but described herein in detail), such as communication interfaces to/from a client or host for fiber communications channel; tunable laser wavelength memory and management; PROM-SPI Flash interface to external memory; setting currents and voltages for all control and monitoring functions for the tunable laser, modulator, optoelectronics, sensor and other control and monitor points that interface via voltages and currents; optical and electronic and photonic integrated circuit (PIC) monitors; boxcar averagers and signal processing functions; automatic optical power control; wavelength locking; linewidth narrowing functions, temperature monitoring and control; alarm and monitoring control and communications; application programming interfaces (APIs); and many other functions for implementing various aspects of the present methodology described herein. Further, the field programmable device 103 may include an internal storage (not shown) and/or an external storage such as the storage or memory 111 coupled to the field programmable device 103 for storing various parameters including parameters for implementing various aspects of the present technology. In an aspect of the present disclosure, the memory 111 may include one or more look-up tables of data in connection with implementing various aspects of the present technology described herein.

Further, in an aspect of the present disclosure, a field programmable device-centric architecture (e.g., FPGA, PLD or the like centric) may be implemented as follows. The host controller 101 may transfer code for one or more algorithms, modules, processes or functions to the field programmable device 103, either as high level programming language (e.g., C code or the like) in an embedded soft processor, or for even more efficiency and high speed, as hardware description language (e.g., HDL code or the like). The host computer 101 may also be connected through a standard interface, i.e., a universal serial bus (USB) connection, to the field programmable device 103. As noted, while performing various aspects of the present technology, the field programmable device 103 may communicate directly with DACs 117 that are configured to drive currents to various components including laser mirrors of the tunable laser 109 and communicates with ADCs 107 that are configured to monitor the electrode voltages and/or power detectors to collect data from the tunable laser 109 in accordance with various aspects of the present technology. Alternatively, and/or in addition to, the field programmable device 103 may control transients in laser temperature by monitoring a thermistor on the tunable laser 109 and driving a current control input to a TEC controller of the tunable laser 109. Further, the field programmable device 103 may buffer or store data relating to controlling, monitoring, and communicating with the tunable laser 109 in one or more storage devices, such as the memory 111, whether it is internal or external to the field programmable device 103, to perform various functions, methods, algorithms or methodologies, in accordance with aspects of the present disclosure.

In an aspect of the present disclosure, the present technology may be viewed as a field programmable device (e.g., FPGA, PLD or the like) centric architecture for optical communications systems. As such, the one or more implementations of the present technology may be optimized for a hardware architecture and the methodology or algorithm itself, incurring negligible overhead in the processing of various aspects of the present technology in the field programmable device 103, and thus data transfers to and from the coupled ADCs 107, DACs 117, and storage 111 may be very efficient.

In another aspect, the present disclosure provides software-enabled features accessible via application programmable interfaces (APIs), offering extensive real-time control and monitoring of one or more modules or processes based on, for example, actual traffic flows. Such programmability provides an unprecedented level of flexibility and responsiveness at an optical layer with real-time scaling and rerouting of a bandwidth, a higher bandwidth extraction from a given fiber plant as well as a reduction in complexity and related cost of planning, building, operating and maintaining data center networks. Rapid control of all aspects of a tunable laser, in which more than one facet are optically available, or integrated transmitter photonic integrated circuit (PIC) assembly that combines a tunable laser and modulator, or optical transceiver or optical subassembly is provided. That is, the present disclosure may provide control which is modular, concurrent, independent processes, fast and reprogrammable, and thus may handle all control, monitoring, and communication aspects, in which any submodule of a system may be replaced, modified, programmed without affecting other modules or processes. In other words, in an aspect, the control, monitoring, and communications system may comprises modular, independent, and/or concurrent processes configured to run in the field programmable device, each of which may be configured to run at different clocks. The advantage of running all control, monitoring and communications in a programmable manner at a gate level may result in lower power, lower cost, wider use across a broader classes of applications, and introduction of new control modules of a variety of types (filter, analog circuits, state machines, etc.) in a common programmable architecture.

As such, the present disclosure may provide for control, monitoring, communications, and algorithm implementations using an internal field programmable device such as am FPGA, PLD, or the like, without using a microprocessor or a microcontroller, and may even use the same firmware for an external FPGA, which is used to calibrate a tunable laser, thereby significantly speeding up the calibration speed of the tunable laser. The resulting calibration data may then be ported to a wavelength control FPGA which is used to control the tunable laser, making the calibration during manufacturing and the control and re-calibration or re-programming uniform with the field programmable device based technology described herein and firmware across all aspects of the use of a tunable laser from manufacturing to deployment in a network, significantly cutting down on the cost of manufacturing and ownership as well as improving performance.

In an aspect of the present disclosure, the communications interface into the field programmable device 103 may provide gate level general programming and interfaces for graphical users interfaces (GUIs) and/or application programmable interfaces (API) that allow software control, monitoring and calibration of a complete tunable laser using a software layer that interacts with the tunable laser through the field programmable device 103 to implement one of any of the algorithms described herein including the fast wavelength calibration algorithms, making the ease of use, manufacturability, speed of calibration, and integration into other manufacturing, system integration and network operation systems enabled and significantly lower cost and make flexible compared to any prior existing technology. The speed of the calibration routines, on the order of minutes, may even allow recalibration in the field or real-time using the application layer interfaces via the field programmable device (e.g., FPGA, PLD or the like).

Advantages of the present disclosure may include, but not limited to, many significant advantages over the existing technology that uses a microcontroller or microprocessor as a main control and an FPGA primarily as a data storage and lookup device. In the past, the performance as a function of footprint and power consumption of field programmable devices such as FGPAs was not considered competitive to microprocessors to handle various functions required for real time data and control in tunable laser applications. However, in recent years, field programmable device technology, including FPGA, PLD, or the like technology, has advanced significantly and has become a preferred and more flexible method and apparatus to control, monitor and communicate than many microcontroller or microprocessor based solutions.

Figure 1B:
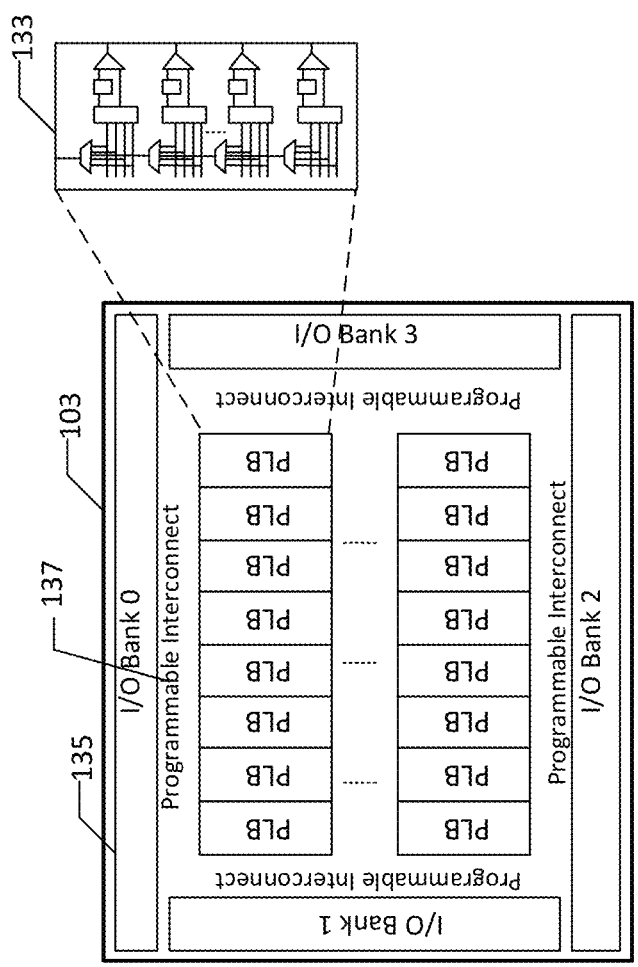
FIG. 1B illustrates an example of a field programmable device in accordance with an aspect of the present disclosure.

By way of example, as shown in FIG. 1B, a field programmable device such as an FPGA is an integrated circuit that can be programmed in the field or real-time after manufacture, unlike certain integrated circuits such as a microcontroller or a microprocessor, which is hard-core. That is, FPGAs are semiconductor device that are based on a programmable/configurable logic blocs connected via programmable interconnects or wiring circuits, thereby enabling the FPGAs to be reprogrammable to desired application or functionality requirements after manufacturing. In other words, an FPGA is a device based on a gate and device interconnection loaded into the FPGA to operate on data and signals at inputs to generate outputs. In one implementation, the field programmable device 103 may include an FPGA or PLD or the like comprising a plurality of configurable logic blocks (CLBs) 133, a plurality of input/output (I/O) ports 135, programmable interconnect 137, etc. Each configurable logic block 133 (CLB) may include various components, such as carry logic, input look-up tables, flip-flops, etc. The operation of the FPGA as well as the clock speed of different processes running on the FPGA may be changed in real time, and thus a wide variety of control, monitoring, feedback, communications and other functions may be realized with hardware level performance in the FPGA. Thus, by way of example, in accordance with an aspect of the present disclosure, a field programmable device (e.g., FPGA, PLD, or the like) based architecture may enable concurrent control, monitoring, and communications processes for the tunable laser or tunable laser based module.

Figure 1C:
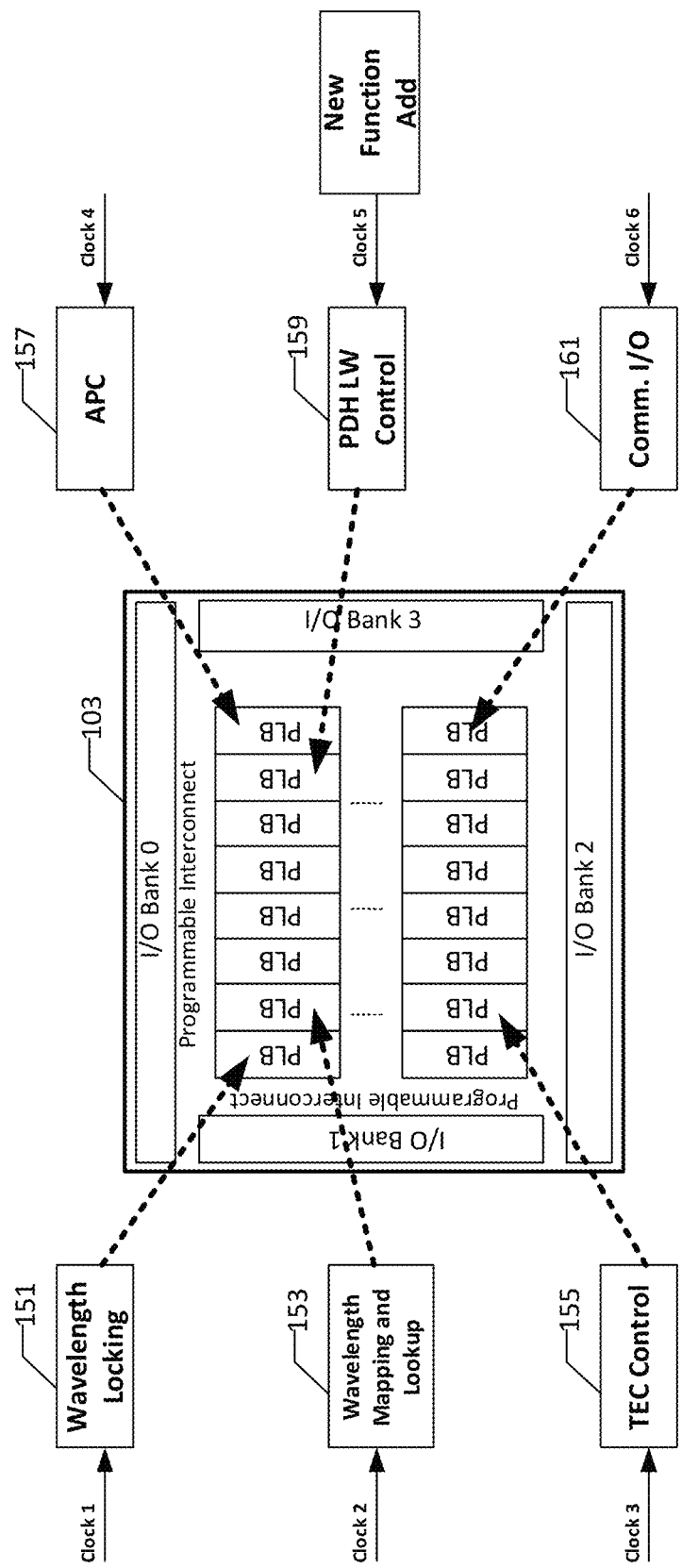
FIG. 1C illustrates an example of how functions are implemented as concurrent, independent processes in the field programmable device.

Further, as shown in FIG. 1C, different areas of the FPGA circuitry may be allocated or used to implement different data and/or control functions all within the single device. By way of example, in FIG. 1C, a plurality of data and/or control functions or modules may be implemented in one or more PLBs, e.g., a wavelength locking 151, wavelength mapping and lookup 153, TEC control 155, automatic power control (APC) 157, PHD Linewidth control 159, communications I/O 161, etc., each running at different clock signals, e.g., clock 1, 2, . . . 6. Further, a new module or process such as a PDH linewidth (LW) control 159 with a clock signal (e.g., clock 5) may be added in real-time.

In an aspect of the present disclosure, some functions that may be realized in accordance with various aspects of the present technology may include but are not limited to:

Control of optical properties of a data modulated tunable laser including a chirp of a transmitted optical signal and adjusting the control based on an output wavelength of the tunable laser and other parameters;

Temperature monitoring and control of temperature sensitive components (e.g., laser, etalon, etc.);

Control and/or adjustment of a laser output power (e.g., by adjusting gain sections and voltage controlled attenuators);

Control of a laser wavelength of a tunable laser by controlling mirrors, resonators, phase sections and other wavelength tunable elements by embedding a current-wavelength control map, that can also be a function of temperature;

Control and monitoring of a wavelength locker circuit and function. The internal mapping can also be changed in real time in response to calibration and re-calibration of the tunable laser using a wavelength locker;

Functions that require larger memory capabilities of FPGAs, like state size, as compared to microcontrollers or microprocessors;

Concurrent processes that can operate independently of each other leading to a higher performance at a given clock speed compared to serial finite state microprocessors, with higher fault tolerance, ability to manage power by turning on and off processes individually and updating processes individually without having to rewrite and recompile the complete code;

Continual operation upon host failure (e.g., a control interface that in the case that the host fails the unit can still continue to operate);

Corrective action (e.g., if laser output power deteriorates or laser wavelength shifts the FPGA can take corrective action—per locker and other mechanisms); and Other functions that can be reprogrammed to fit different applications. One chip or a smaller subset of electronic chips may therefore be used across a wider variety of applications and PIC, switches, or transmitter and receiver subassemblies driving up the volume and lower cost and eventually power consumption and size.

As noted above, some examples of the programmable firmware functions that may be implemented in the field programmable device 103 such as the FPGA, PLD or the like, may include but not limited to (functions or examples below may be implemented alone or in combination with others):

Host communications interfaces and memory map;

Wavelength memory and management;

Programmable read-only memory (PROM)-serial peripheral interface (SPI) FLASH interface to external erasable programmable read-only memory (EPROM);

Set currents and voltages;

Optical and electronic and photonic integrated circuit (PIC) monitors;

Boxcar averagers;

Automatic power control;

Wavelength locking;

Linewidth narrowing algorithms (like Pound Dreyer Hall (PDH));

Temperature monitoring and control;

Alarm and monitoring control and communications; and

Figure 2:
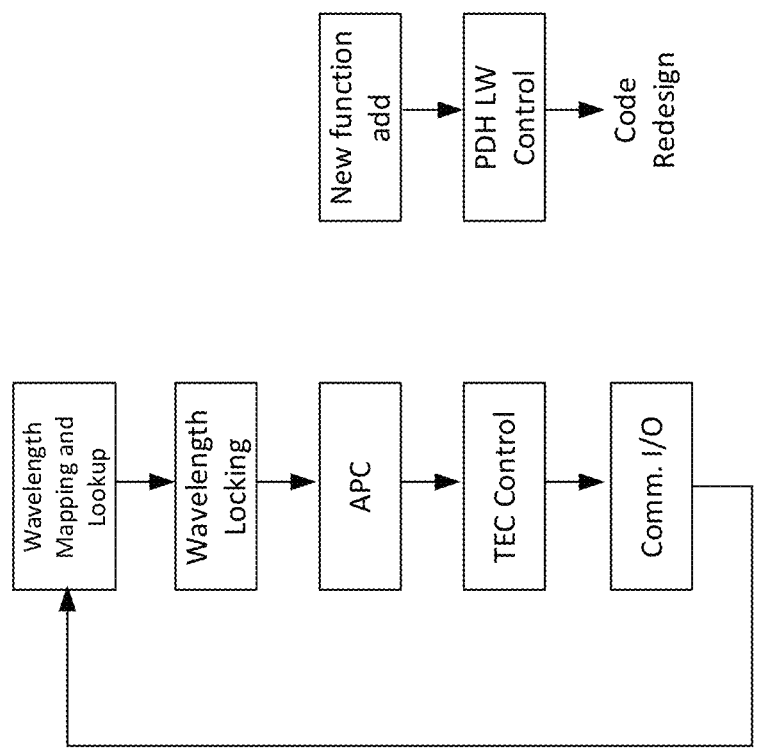
FIG. 2 illustrates a typical implementation of a tunable laser or transceiver control, monitor, and communications using a microprocessor or microcontroller based architecture.

Application programmable interfaces;

As noted earlier, FIG. 1C illustrates an example of how some of the functions that may be implemented as concurrent, modular processes, while providing an advantage over the existing technology using a microcontroller and/or a serial state machine as shown in FIG. 2, which illustrates a typical implementation of a tunable laser or transceiver control, monitor, and communications using a microprocessor or microcontroller based architecture. As shown, the microprocessor or microcontroller by design executes the functions, modules or processes in a sequential manner, for example, executing the wavelength mapping and lookup 161, wavelength locking 163, APC 165, TEC control 167, and communication I/O 168. Further, if a new function such as a PDH LW control 173 is to be added (at 171), then code need to be redesigned for the microprocessor or microcontroller.

However, as noted above, in accordance with an aspect of the present disclosure, the present technology provides the field programmable device 103 (e.g., FPGA, PLD or the like) which may implement various functions, modules or processes relating to control, monitor, and communication with a tunable laser or transceiver, as concurrent, independent modules or processes which are configured to run at different clock signals, without use of the microprocessor or microcontroller.

Host Communication Interfaces and Memory Map

In an aspect of the present disclosure, the field programmable device 103 may include a slave controller that may implement standard serial protocols, such as an Inter-IC bus (I2C) and/or serial peripheral interface (SPI), or other proprietary protocols. The advantage of the present technology over any microprocessor/microcontroller or system-on-chip (SoC) based system is that the slave controller of the present disclosure is not a hard-core, and thus it may easily be modified to suit host interface requirements in the field programmable device 103.

By way of example, in an aspect of the present disclosure, a register map architecture may be based on two dual port random access memories (RAMs), one for a register map and one for wavelength table data which may be implemented in (or external but coupled to) the field programmable device 103. Host read/writes to the register map may then be directly addressed to one port of the register table RAM, while up/download of the wavelength table data is accomplished through a set of registers that include the parameters for a single wave table entry and redirect this data to an appropriate location in a wave table RAM. The second RAM port may be used for updating of digital-to-analog (DAC) data from RAM, reading of analog-to-digital (ADC) monitor data to RAM, and updating of laser/modulator control parameters from the wave table RAM when wavelength is changed or as dictated by a system. Dedicated control logic may perform RAM to ADC/DAC transactions, without the use of a microcontroller or microprocessor. The logic implemented in the field programmable device 103 may be optimized further for transfer efficiency, has predictable latency, and can be tuned to prioritize transactions that require very low latency.

In another aspect of the present disclosure, a registered memory map of the field programmable device 103 may be implemented within the field programmable device 103 and controlled via a host communication interface. The registered memory map may define a current state of a control system, which in turn determines the wavelength and output power of a tunable laser assembly. The state of a control system may be a result of electrode currents, bias voltages, device operating temperature and various configurable settings associated with the tunable laser like a TEC PID control loop and wavelength locker, for example. All of these individually configurable modules or processes may be changed and monitored by writing to or reading from an appropriate register in the registered memory map of the field programmable device 103, without the use of the microprocessor or microcontroller.

Figure 3:
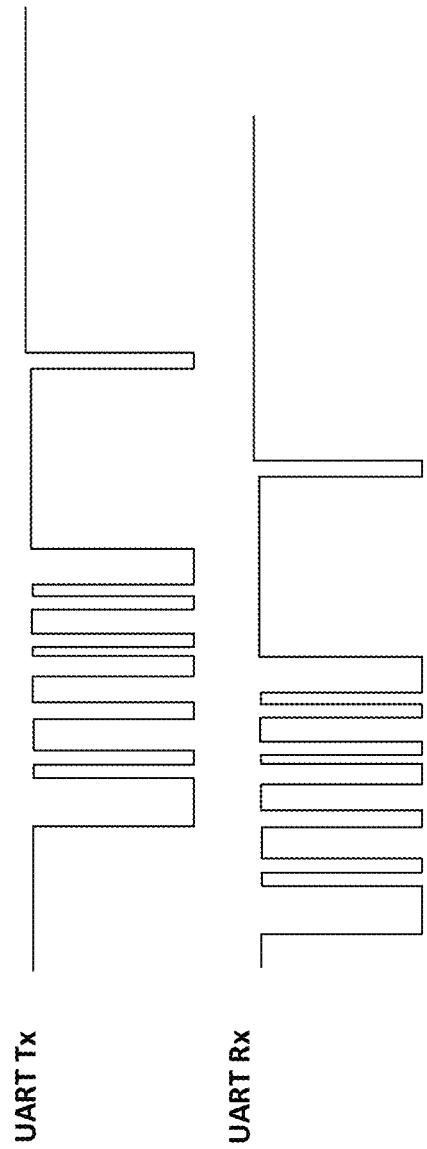
FIG. 3 illustrates an example of an implementation of a Register Write operation in accordance with an aspect of the present disclosure.

By way of example, an example implementation of a Register Write operation via UART is shown in FIG. 3. In the implementation, a UART is used to communicate to an I2C device. As shown in FIG. 3, the field programmable device 103 receives a command from a host or host controller 101 via a UART string (e.g., UART Tx from the host to the field programmable device), the UART string is echoed back to the host or host controller (e.g., UART Rx from the field programmable device to the host), the command is then interpreted, and an I2C command is issued to a register interface on the I2C bus coupled to the field programmable device 103. The UART then sends a string back with the written data. In the implementation, for a register write cycle it may take approximately 1.2 ms.

Automatic Power Control (APC)

Figure 4:
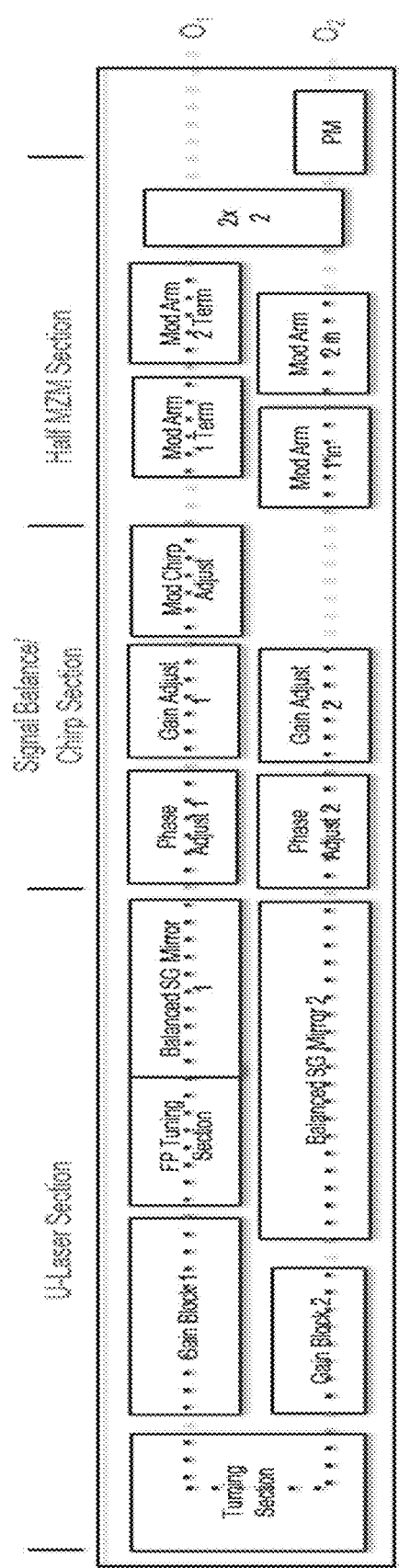
FIG. 4 illustrates an example of a block diagram of a photonic integrated circuit (PIC) tunable modulator.
Figure 5:
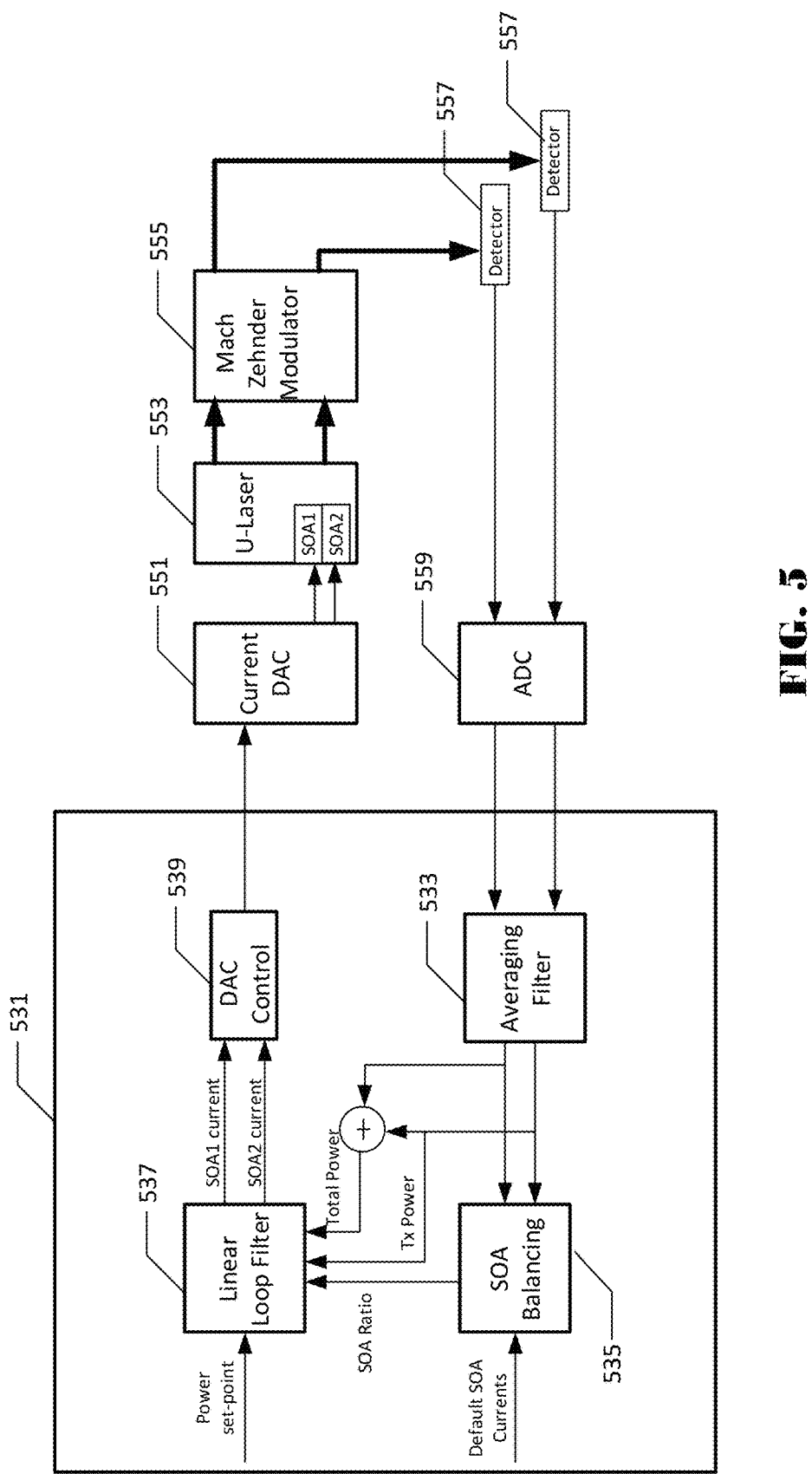
FIG. 5 is an example block diagram of an external control function or loop using the field programmable device technology in accordance with an aspect of the present disclosure.

In an aspect of the present disclosure, an automatic power control (APC) function or loop may be implemented as a concurrent, independent module or process within the field programmable device 103. An APC control function or loop dynamically maintains a laser output power at a commanded level while also maintaining a ratio of semiconductor optical amplifier (SOA) currents in a tunable laser (e.g., a U-Laser), which in turn maintains a balance of photocurrents in Mach Zehnder modulator legs, which is required for proper modulation. FIG. 4 illustrates a block diagram of an example PIC tunable modulator as described in U.S. Patent Application Ser. No. 61/748,415, published on Jul. 10, 2014 as WO2014/107537 with elements that enable APC and the APC loop. Further, an example block diagram of an external control function or loop using the field programmable device technology such as FPGA, PLD or like technology is also shown in FIG. 5.

In an aspect of the present disclosure, a field programmable device 531 (similar to the field programmable device 103 shown in FIG. 1A) may include an averaging filter 533, a SOA balancing 535, a loop filter 537, and a DAC control 539. In the example, the averaging filter 533, SOA balancing 535, loop filter 537, and DAC control 539 may all be implemented digitally as one or more concurrent, independent modules or processes within the field programmable device 531. The field programmable device 531 (e.g., FPGA or PLD or the like technology) is configured to allow performing these functions optimally and with low fixed latency and high noise immunity. Further, in the example, current DAC 551 and ADC 559 may be located outside but coupled to the field programmable device 531, and the field programmable device 531 drives the laser SOA currents to a tunable laser (e.g., U-laser 553) through the external current DAC (e.g., Current DAC 551). The detected optical powers, via detectors 557, from two legs of the Mach Zehnder Modulator 555 may be digitized in the external ADC 559 and input to the field programmable device 531, which first passes them through the averaging filter 533 to smooth a response and filter noise picked up in an analog path.

The filtered detected powers are input to the SOA balancing 535, which starts with default SOA currents provided from a wavelength table (not shown) and then measures the detected powers to determine a proper ratio of SOA currents to maintain balanced MZM outputs. This ratio is fed to the loop filter 537 along with Tx Power, which is the power out of leg 1 of the Mach-Zehnder Modulator 555, and total power, which is a sum of the powers in the two modulator legs. The linear loop filter 537 may be configured to adjust SOA1 and SOA2 currents in fixed steps, while maintaining a ratio of the SOA1 to SOA2 currents until a desired Tx power is attained. An initial step size in the larger of SOA1 or SOA2 may be in 1000 uA increments. When the output power is within one 1000 uA increment, the step size may be reduced to 125 uA and a final "Vernier" search may be performed until the output power is within one 125 uA step. If the measured power changes by more than 2 counts or 250 uA, the Vernier search resumes. If the tunable laser is reinitialized (e.g., turned off and then on), however, a crude search may restart followed by the Vernier search.

It is also noted that theoretically, SOA current may affect laser wavelength tuning and stability through its electrical and thermal effects. When SOA current changes, its control circuits could affect the circuits that control the laser's gain sections, laser phase section and mirror sections, thus affect the wavelength's tuning and stability. In addition, SOA current change could affect the thermal stability around the mirrors, which affects the mirrors' performance, in turn it affects the wavelength tuning and stability.

In one implementation of the APC function in the field programmable device 531, the SOA power may be adjusted proportionally per wavelength using a real time control loop to maintain output power. Measurements to date have shown that, with the APC and wavelength locker modules operating cooperatively, small incremental adjustments of the SOA may not significantly affect the wavelength.

In an aspect of the present disclosure, the wavelength and power stability may be summarized as examples as below.

| State | Power | Wavelength | Time | Comments |
| --- | --- | --- | --- | --- |
| Off | <=−30 dBm | +/−0.9 nm | | |
| Power-on | <=1 mW/s, <=1 dB overshoot | +/−0.2 nm | <30 s | APC may be modified to reduce power per specified slope |
| Active | +/−1 dB | +/−25 pm | | Wavelength tuning 2 s |
| Power-off | −2.1 dB | +/−0.3 nm | | Lambda inside mask with indicated vertices as power slopes down |
| Power-off | −5.6 dB | +/−0.4 nm | | |
| Power-off | −7.6 dB | +/−0.7 nm | | |
| Off | <=−30 dBm | +/−0.9 nm | <=2 ms (DWDM), 10 us (SFP+) | Time from full power to off |

Automatic Wavelength Mapping (AWM)

One of the limiting factors in reducing power consumption of optical laser modules is the need for active temperature stabilization of a laser to keep the lasing wavelength within the specified accuracy. Typically, a laser needs to be stabilized to within ±0.05° C., and especially in the extreme regions of a temperature range (a typical temperature range is −5° C. to 70° C.) the thermoelectric cooler (TEC) configured to facilitate temperature stabilization may consume a significant amount of power to meet this specification. For example, when the laser needs to be at a temperature of 20° C. and the environment is at 70° C., meaning that the laser package is at 80° C. to 85° C., the TEC needs to span a temperature gap of 60° C. to 65° C.

In an aspect of the present disclosure, a means to reduce a load of the TEC and in some instances completely remove the load may be provided by, instead of keeping laser control currents fixed and stabilizing the laser, letting the laser control currents automatically adapt to the temperature. To exemplify the embodiment further, instead of operating the laser at 20° C., one could operate the laser at 60° C. and thus reduce the gap from the laser temperature to the laser package temperature to 20° C. to 25° C. This may be done "dynamically," based on the measured temperature, and by moving between tables stored a-prior in a field programmable device (531 or 103) such as an FPGA, a PLD or the like, or extrapolating between temperature wavelength maps using certain algorithms and fit functions. The effects of dynamic temperature setting of a tunable laser may include: (i) overall reduction in power consumption of an optical transmitter since the temperature delta (or difference) between the tunable laser and the case temperature of the optical transmitter may be maintained as small as possible by adjusting a set-temperature of the tunable laser as the case temperature changes, and (ii) a range of an operating temperature of the optical transmitter may be widened compared to the existing technology which sets the laser temperature at a certain temperature value.

Figure 6A:
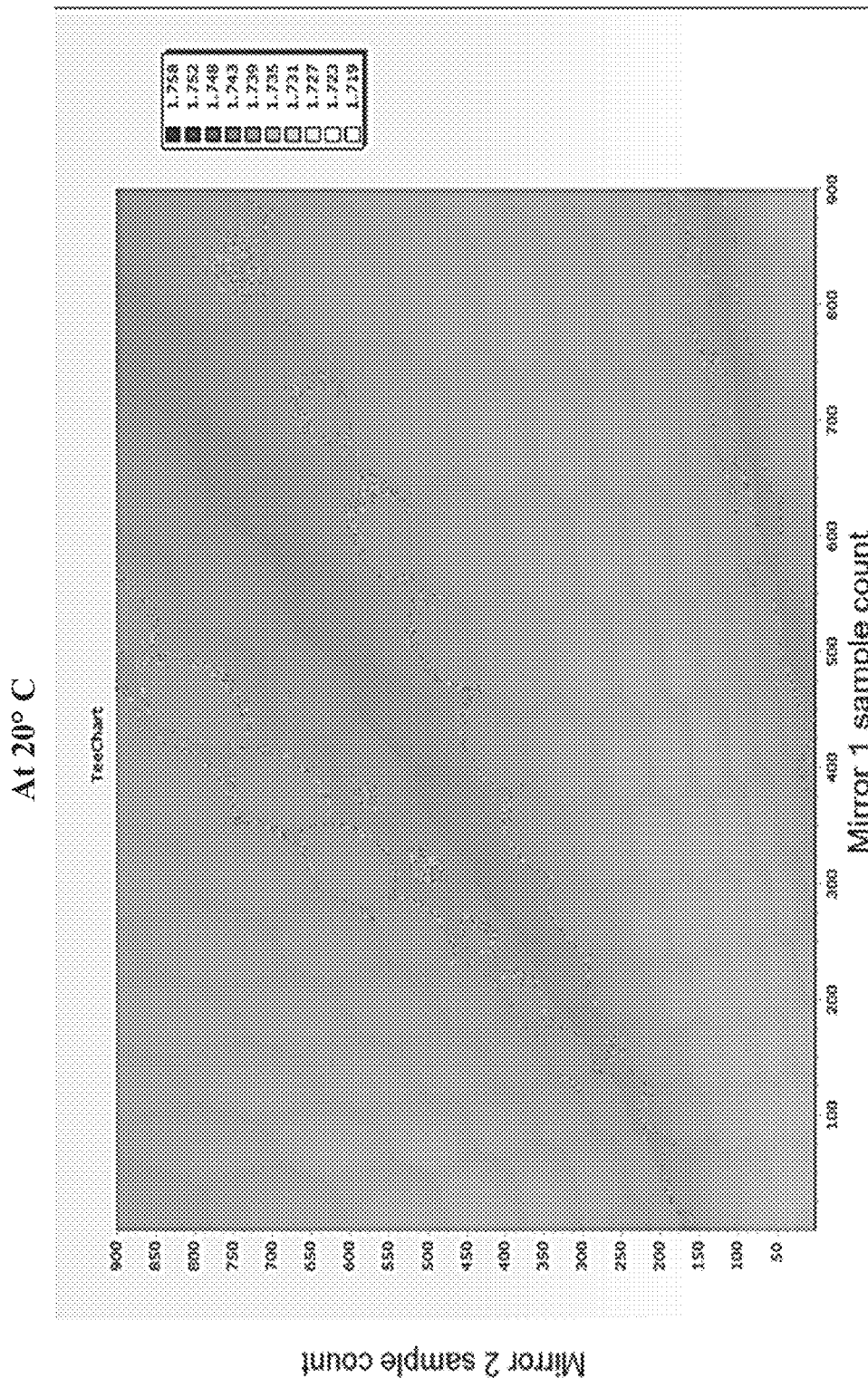
FIGS. 6A-6C illustrate examples of gain voltage maps obtained by tuning laser mirror currents of a tunable laser at three different temperatures in accordance with an aspect of the present disclosure.
Figure 6B:
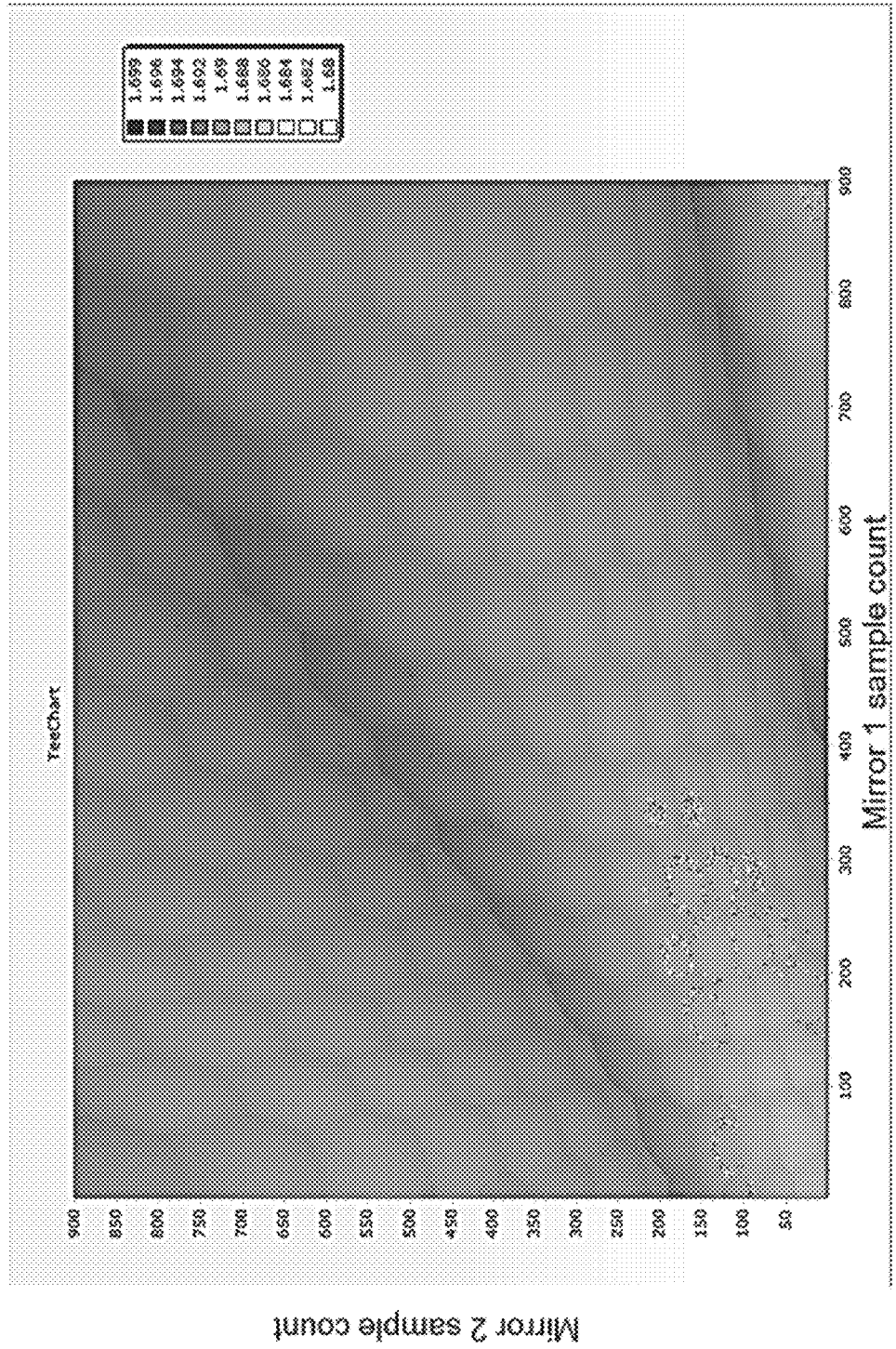
Figure 6C:
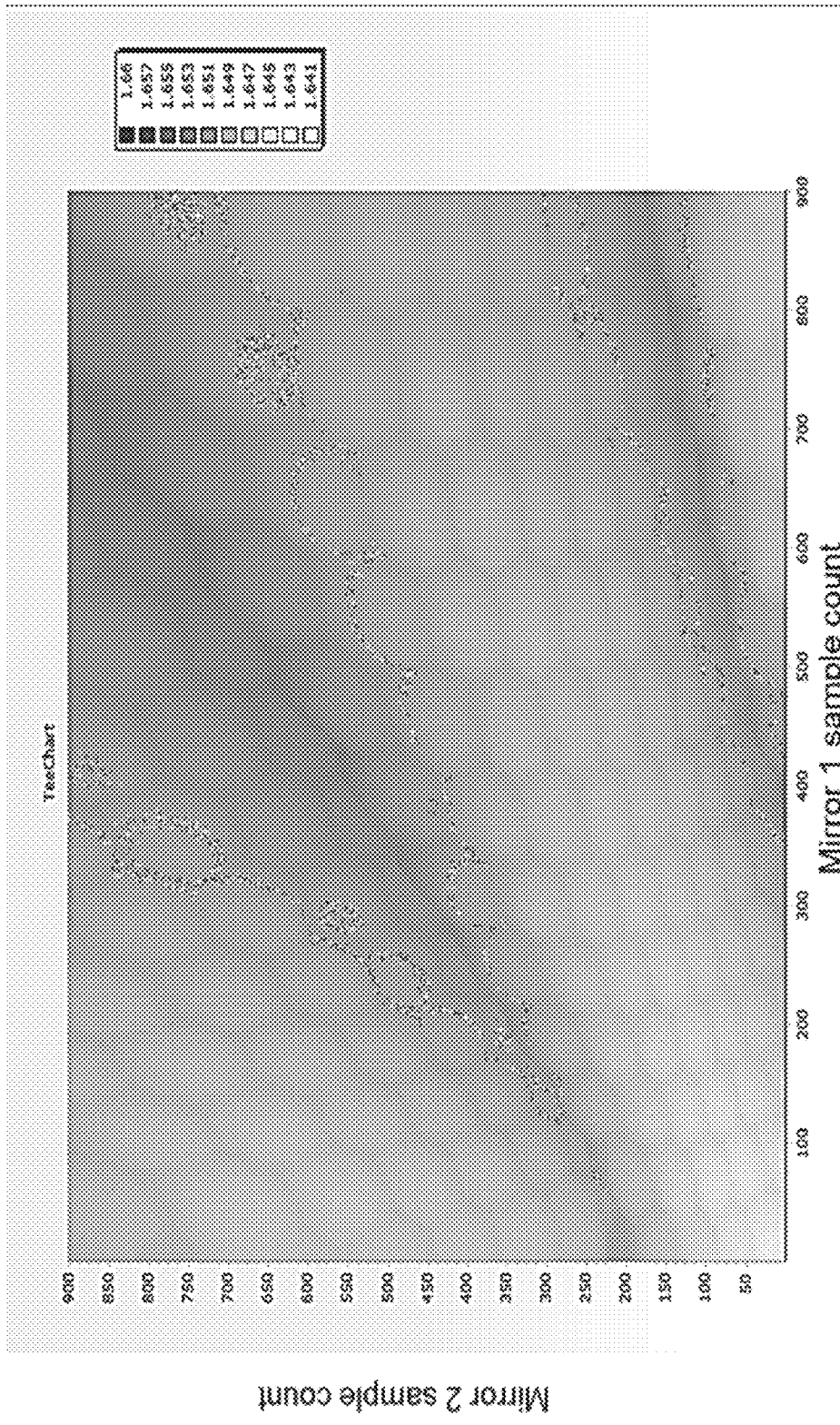

FIGS. 6A-6C show examples of gain-voltage maps obtained by tuning laser mirror currents of a tunable laser at three different temperatures (e.g., 20° C., 30° C., and 40° C.). In this present disclosure, the three different temperatures may be referred to as the calibration temperatures. In an aspect, tuning points or wavelengths are identified using one or more calibration algorithms, such as algorithms described in U.S. patent application Ser. No. 62/073,713, and its corresponding utility patent application, which are incorporated herein by reference in its entirety, for each map and loaded into the FPGA.

For example, FIG. 6A illustrates an example of a gain-voltage map which is obtained by tuning laser mirror currents of a tunable laser having two mirrors at a temperature of 20° C. In the example, the gain-voltage map is generated by observing optical output power as values of two mirror currents are varied. Further, all the minima of the gain-voltage map may be identified, via various processing, as points where the tunable laser is outputting a maximum power, and thus associated wavelengths may be extracted. The extracted wavelengths (or lasing wavelength peaks) may be used for tuning and calibrating processes of the tunable laser. Similarly, at temperatures of 30° C. and 40° C., corresponding gain-voltage maps may be generated respectively as shown in FIGS. 6B and 6C. In the example, it is noted that the gain-voltage maps are different based on the temperature values.

Figure 7A:
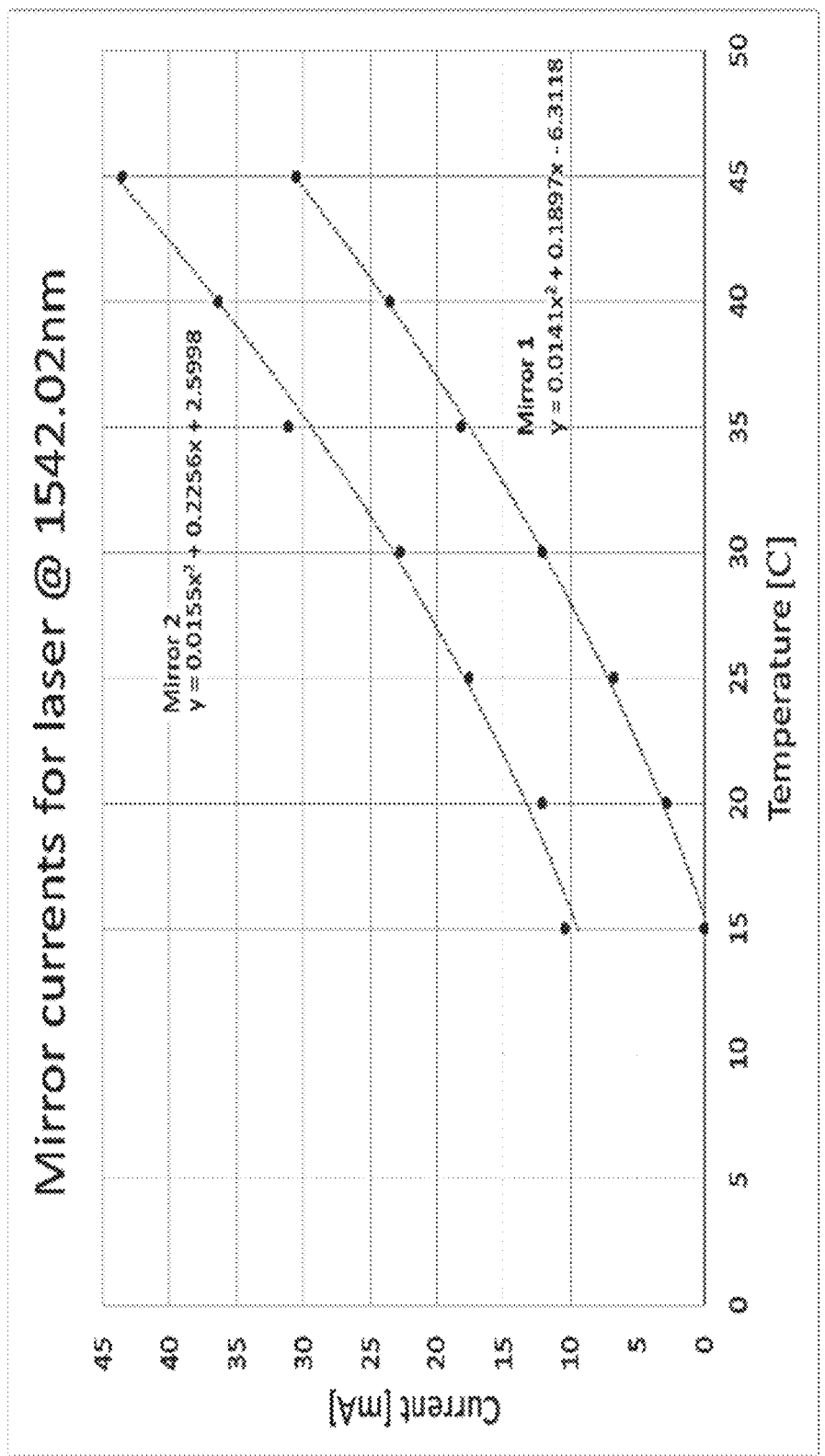
FIGS. 7A and 7B are examples of tuning approximations for two laser mirror currents at 1542.02 nm and 1577.16 nm wavelengths versus temperature.
Figure 7B:
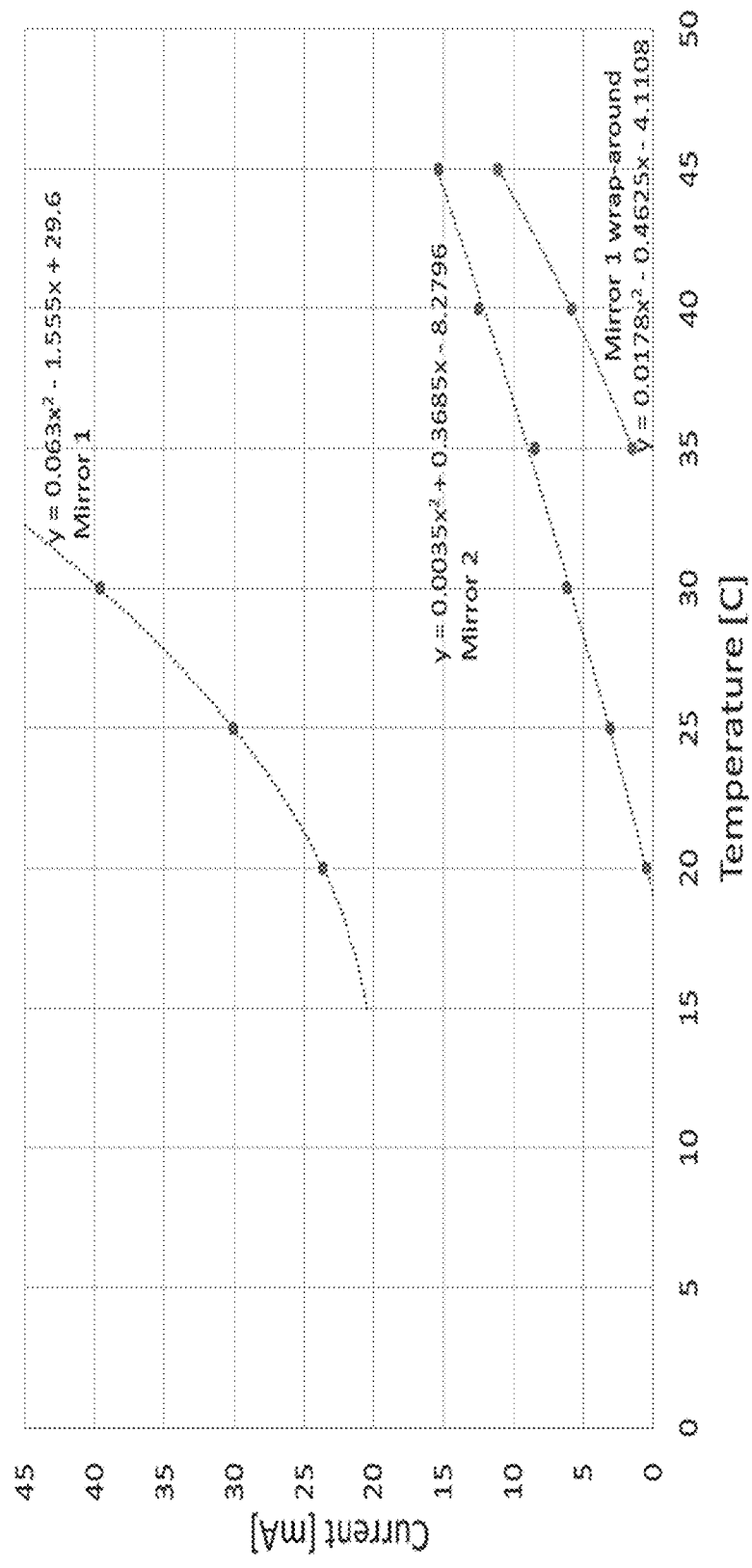

In an aspect of the present disclosure, the automatic wavelength mapping process may be implemented as a concurrent, independent module or process in the field programmable device 103 or 531, and may be configured to enable control loops to use data at different calibration temperatures. The adjustment of tuning currents for the laser mirrors may be done using one or more algorithms, and points from the tuning maps (or the gain-voltage maps) are described in more detail below as well as shown in FIGS. 7A and 7B. From the gain-voltage maps, the temperature dependence of the mirror currents may be estimated and analytical approximations may be derived. The temperature dependence of the mirror currents may then be derived from three or less gain-voltage maps taken at different temperatures given detailed knowledge of the tunable laser itself.

By way of example, the characteristics of the mirror currents, $I_{mirror}$, as a function of temperature t, can be accurately approximated by a second order polynomial equation as shown below.

$$I_{mirror}(t)=at^2+bt+c$$

where a, b and c are constants that may or may not be specific to a given wavelength and t is the temperature of the laser. Therefore, each channel may or may not require additional parameters associated with it to accurately apply mirror currents with varying temperature.

As noted, in FIGS. 7A and 7B, an example of tuning approximations for the two laser mirror currents at 1542.02 nm and 1577.16 nm wavelengths versus temperature is provided. In the examples of mirror currents, one can observe a continuous current over 30° C. on the left curve and a wrap-around scenario where one mirror current exceeds that maximum allowed current and wraps around as a curve, as shown in a bottom part of FIG. 7B. The latter is in some cases not desirable and thus the continuous example on the left may be the only feasible option for use. There may be thus two options that, if both employed, can avoid the "wrap-around" scenario: (i) when doing gain-voltage scans typically each wavelength is found multiple times and one can thus eliminate some of the wrap-around channels and in addition, (ii) the mirrors can have higher current limitations removing the remaining wrap-around channels. Typically, the latter is avoided to reduce power consumption as the wrap-round is perfectly acceptable when the temperature is fixed (the currents are changed only when a channel is changed and significant current changes are acceptable in this case). When the temperature is not fixed, mirror currents may increase and thus PIC power consumption also increase, as the cost in power is minimal compared to what is saved on the TEC power.

Further, it is noted that as can be seen in FIGS. 6A-6C, different gain-voltage maps are observed over different temperatures. Various aspects of the automatic wavelength mapping, tuning and calibration of the tunable laser, as described herein, may be implemented as one or more concurrent, independent modules or processes in the field programmable device 103 or 531, and subsequently be configured to use data (e.g., data relating to the lasing wavelengths and others) at different calibration temperatures. Further, in an aspect of the present disclosure, the gain-voltage maps observed at the different temperatures may be used to determine lasing wavelengths at the different temperatures of the tunable laser. Also, the temperatures of the tunable laser in the field may be adaptively changed via one or more currently running processes in the field programmable device or by control through one or more graphical user interfaces described below. Alternatively, the laser mirror currents may be automatically adapted based on the gain-voltage maps at different temperatures (also referred to herein as the laser mirror currents adaptation).

In an aspect of the present disclosure, a remote operator may have complete control of parameter settings of the tunable laser, via various graphical user interfaces (GUIs) configured to communicate through embedded processes in the field programmable device 103 or 531 (e.g., FPGA or PLD or the like) to the laser current and temperature settings of the tunable laser. For example, the remote operator may change various parameter settings at different temperature settings and observe optical output spectra. In the example, FIGS. 8A-11B show GUIs that may be configured to control the laser current and temperature settings at 23° C., 30° C. and 40° C., with respective output spectra under the control of an operator via the GUIs.

In one implementation, the GUI function may be integrated in the field programmable device or a system including the field programmable device, connected to the system via one or more wireless techniques, or connected to the system over optical transmission line(s) from a remote site or location. In particular, the GUI control function may be performed at the system via one or more communication interfaces including API, I2C, GPIO, or etc. of an optical transmitter (or transceiver). Also, one or more control signals may be supplied from a GUI of the system, a GUI connected to the system via one or more wireless techniques, or a GUI connected to the system over optical transmission line(s) where the one or more control signals come from a GUI of another system at a remote site. Further, when the one or more control signals come from the GUI of another system at the remote site, the optical receiver of the system may read or decode input signals directly to control a wavelength of the system. Alternatively, the one or more control signals from the GUI of another system at the remote site may be received and decoded by a host coupled to the system and subsequently issue one or more commands to control the wavelength of the system.

Figure 8A:
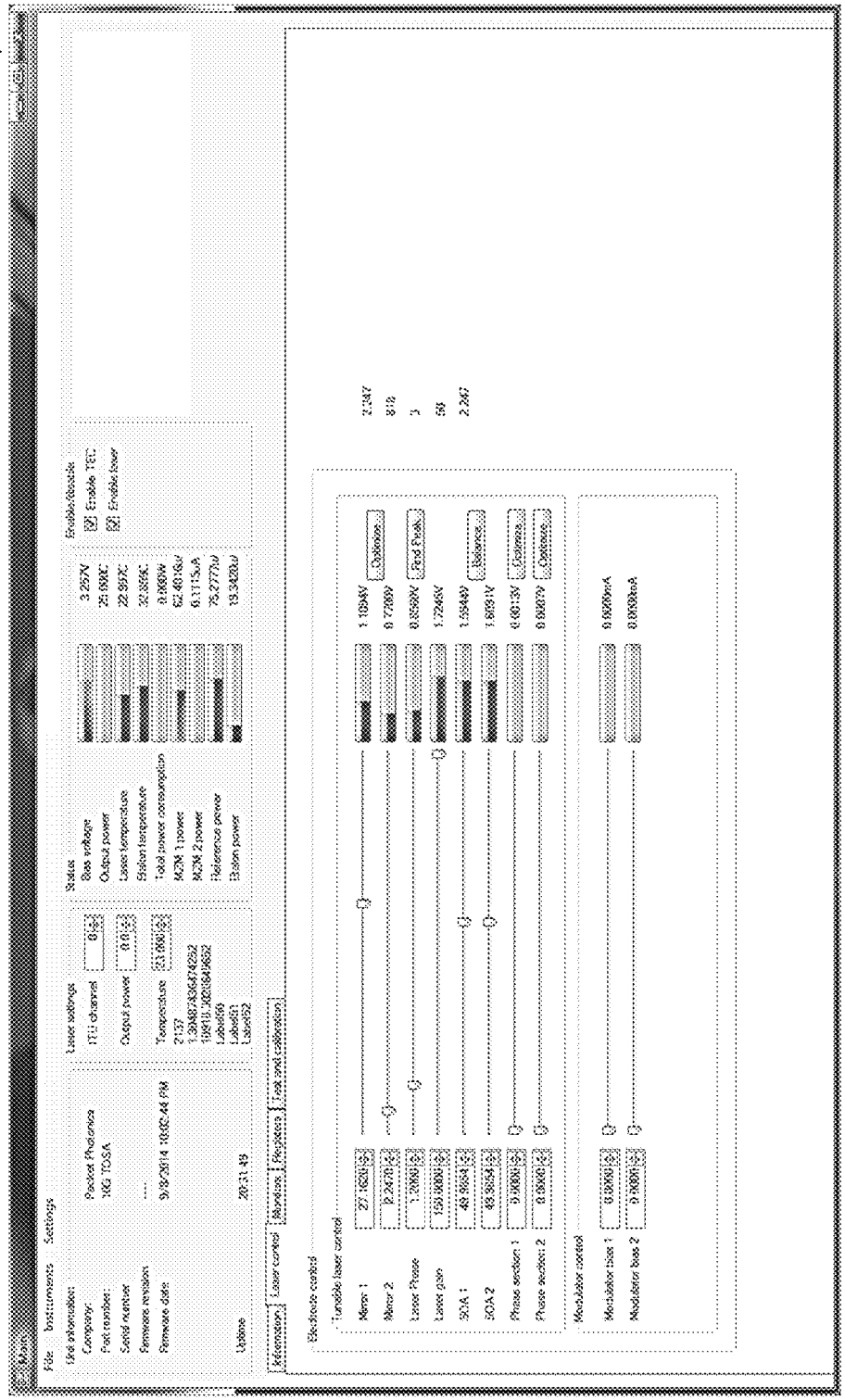
FIGS. 8A-11B illustrate examples of graphical user interfaces (GUIs) that are configured to communicate through processes running in a field programmable device.
Figure 8B:
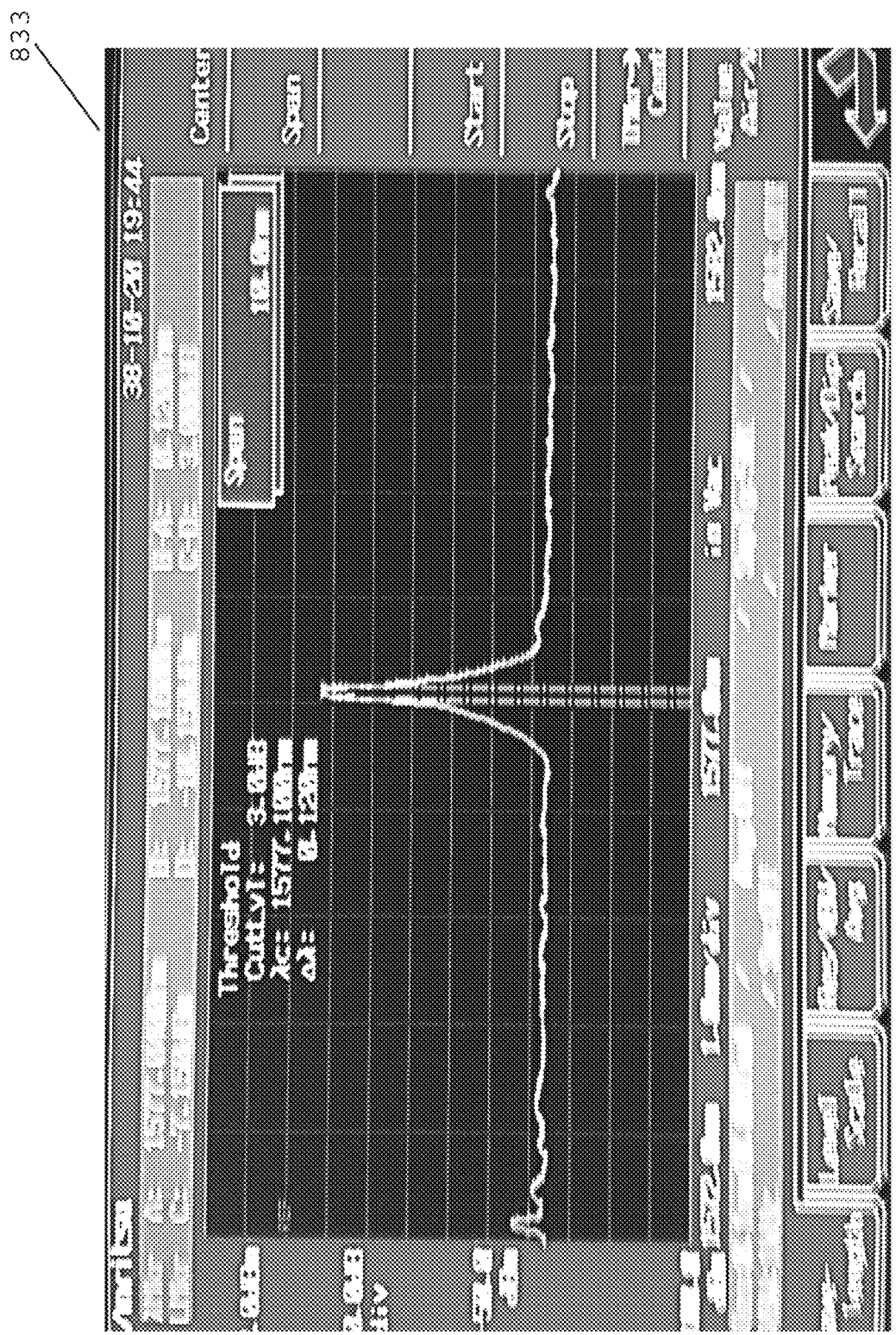
Figure 9A:
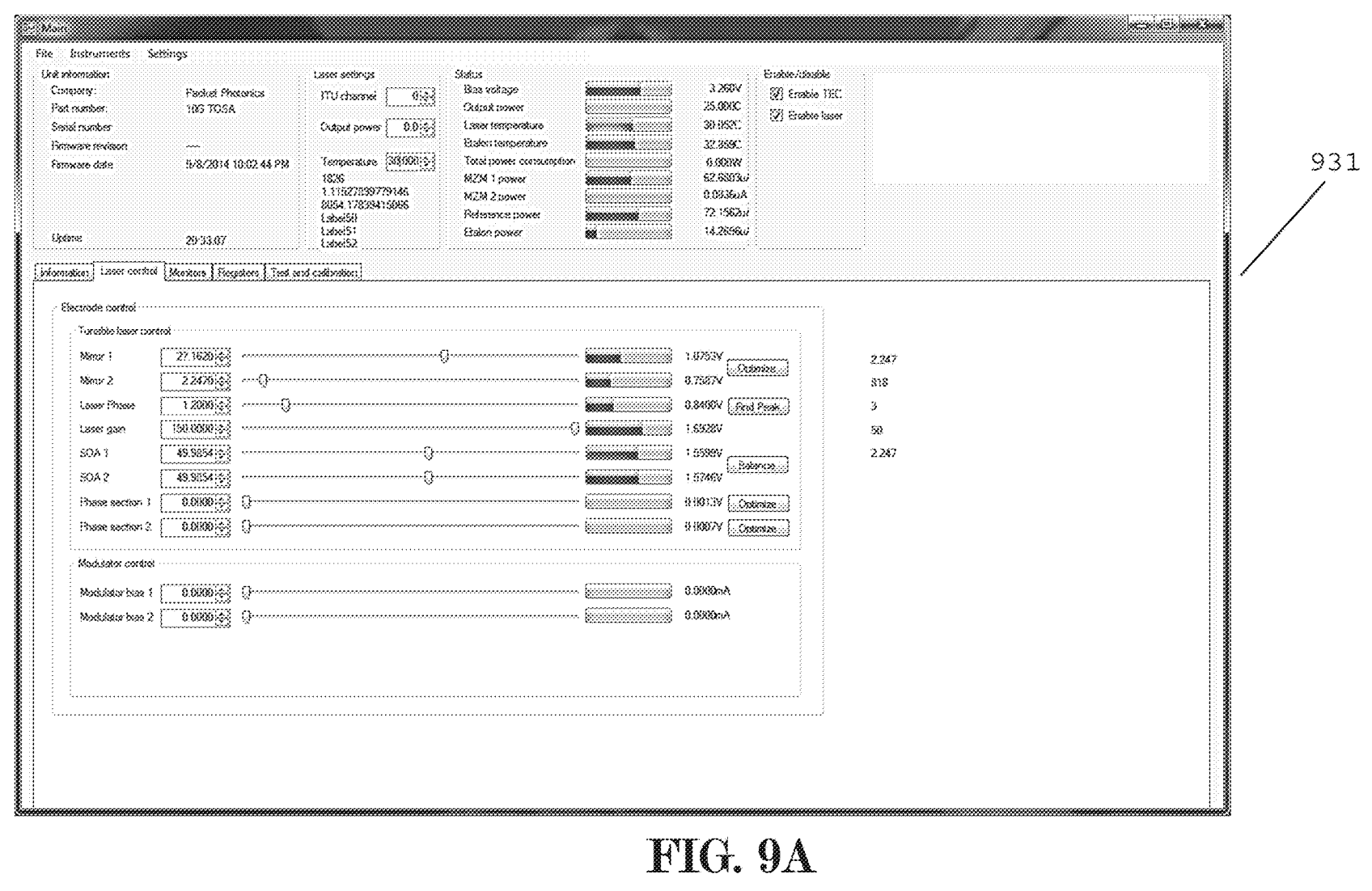
Figure 9B:
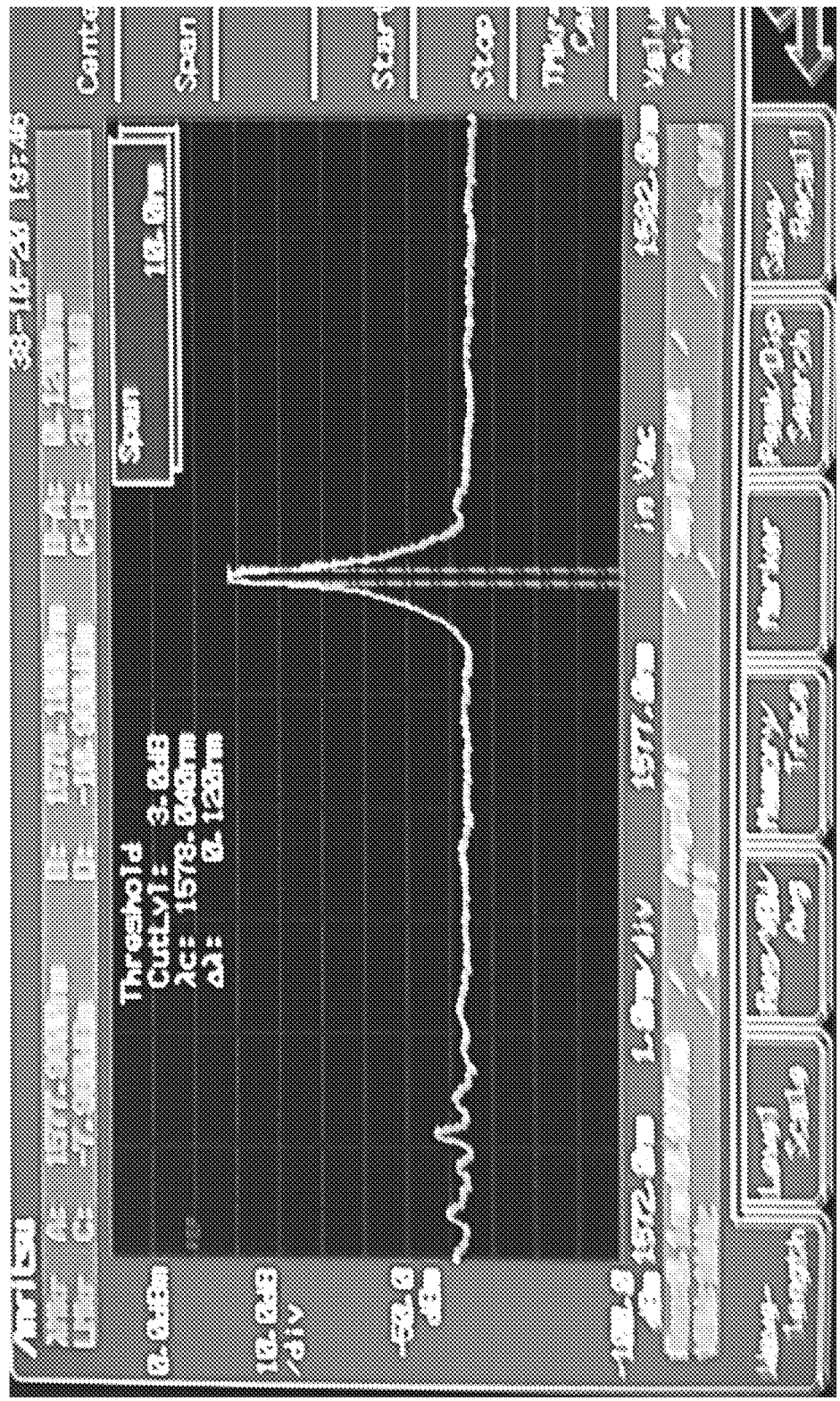
Figure 10A:
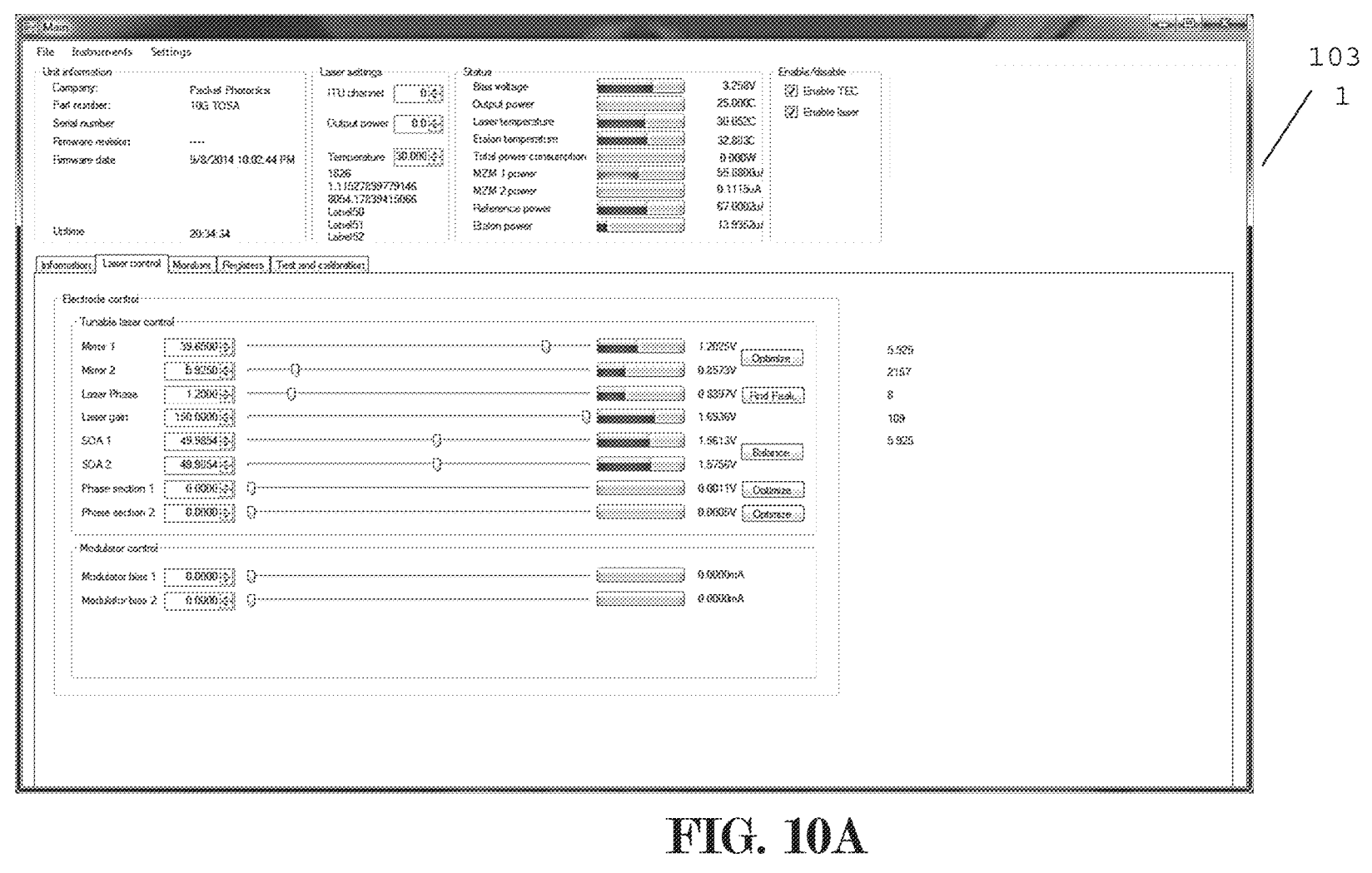
Figure 10B:
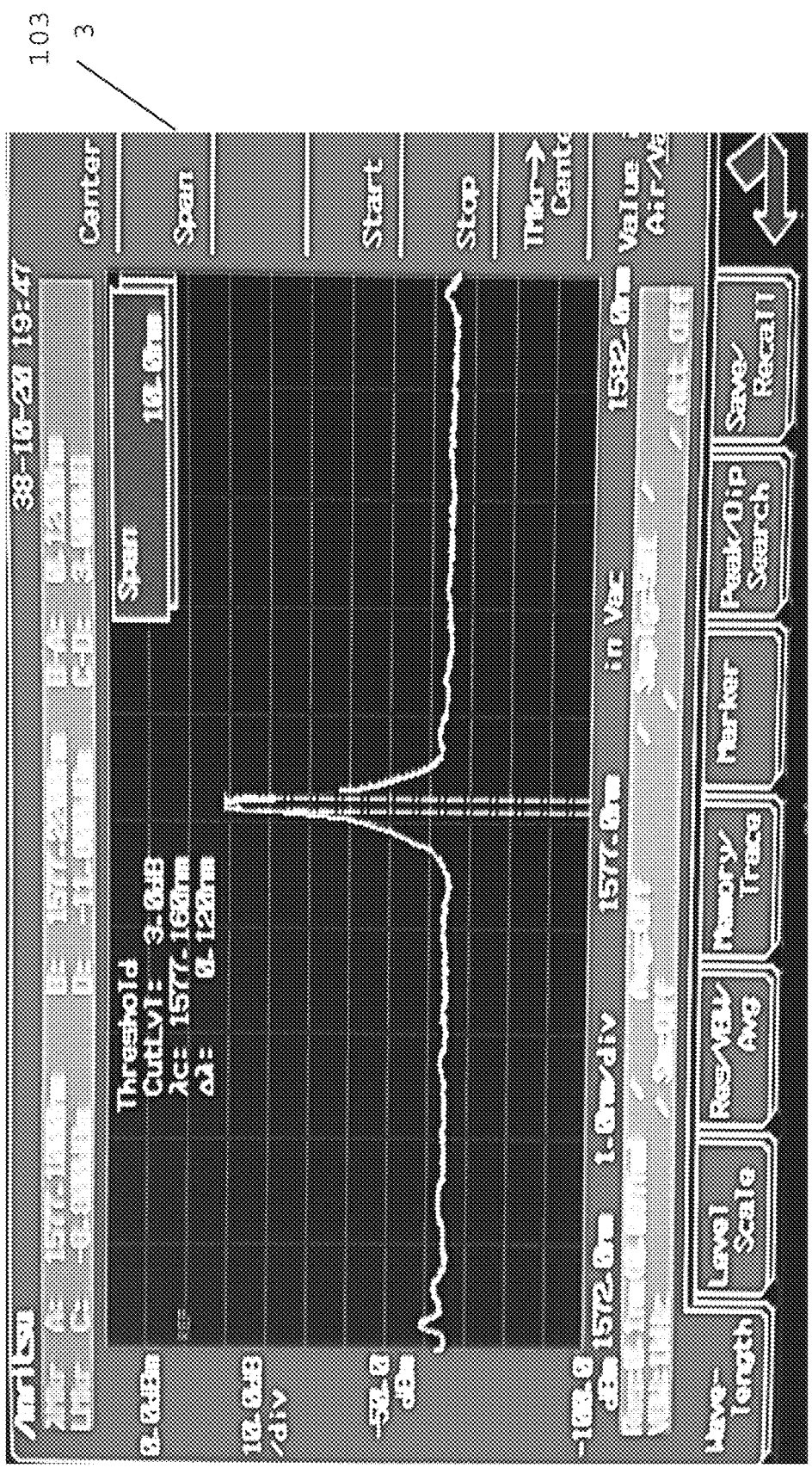
Figure 11A:
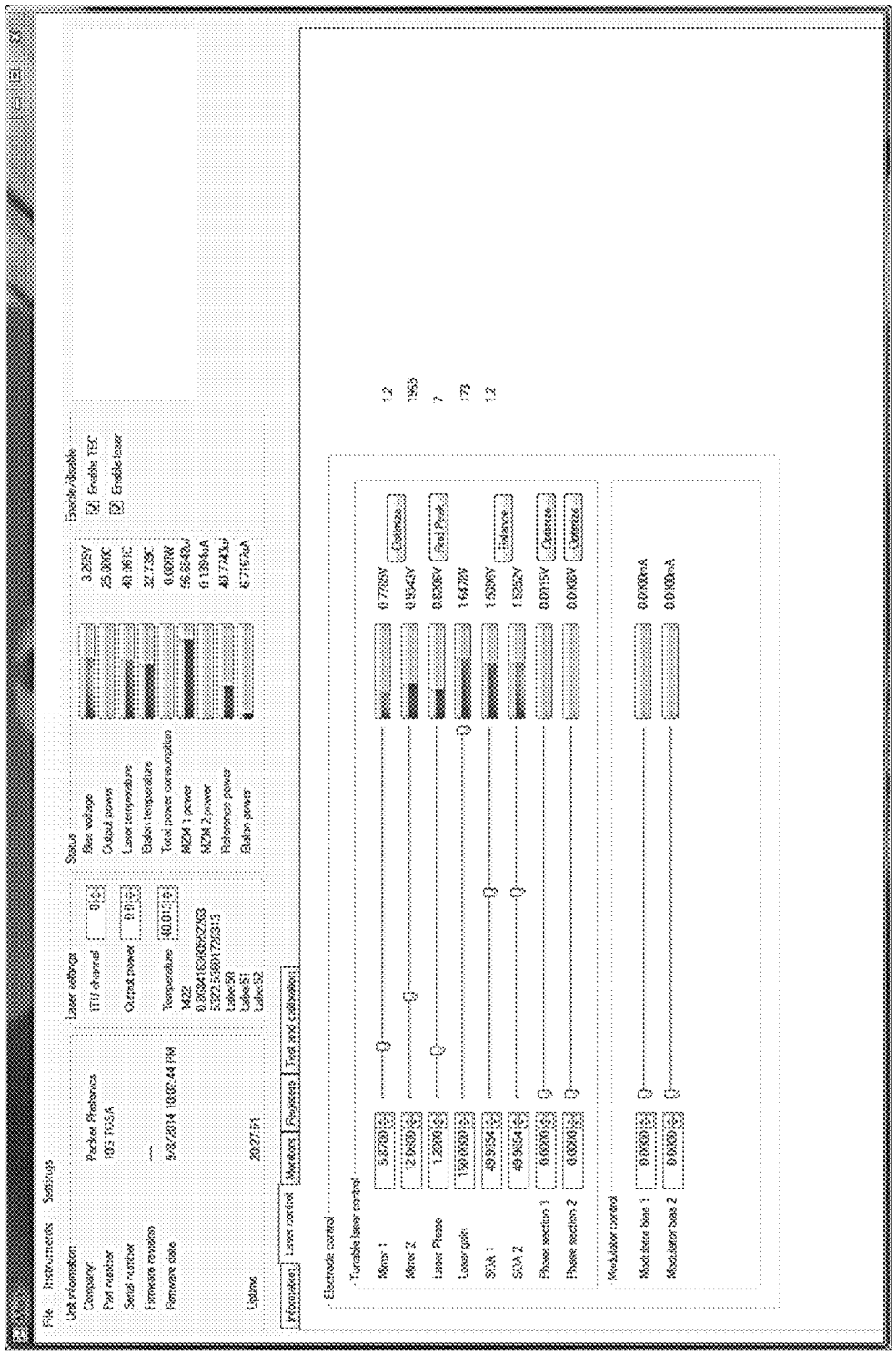
Figure 11B:
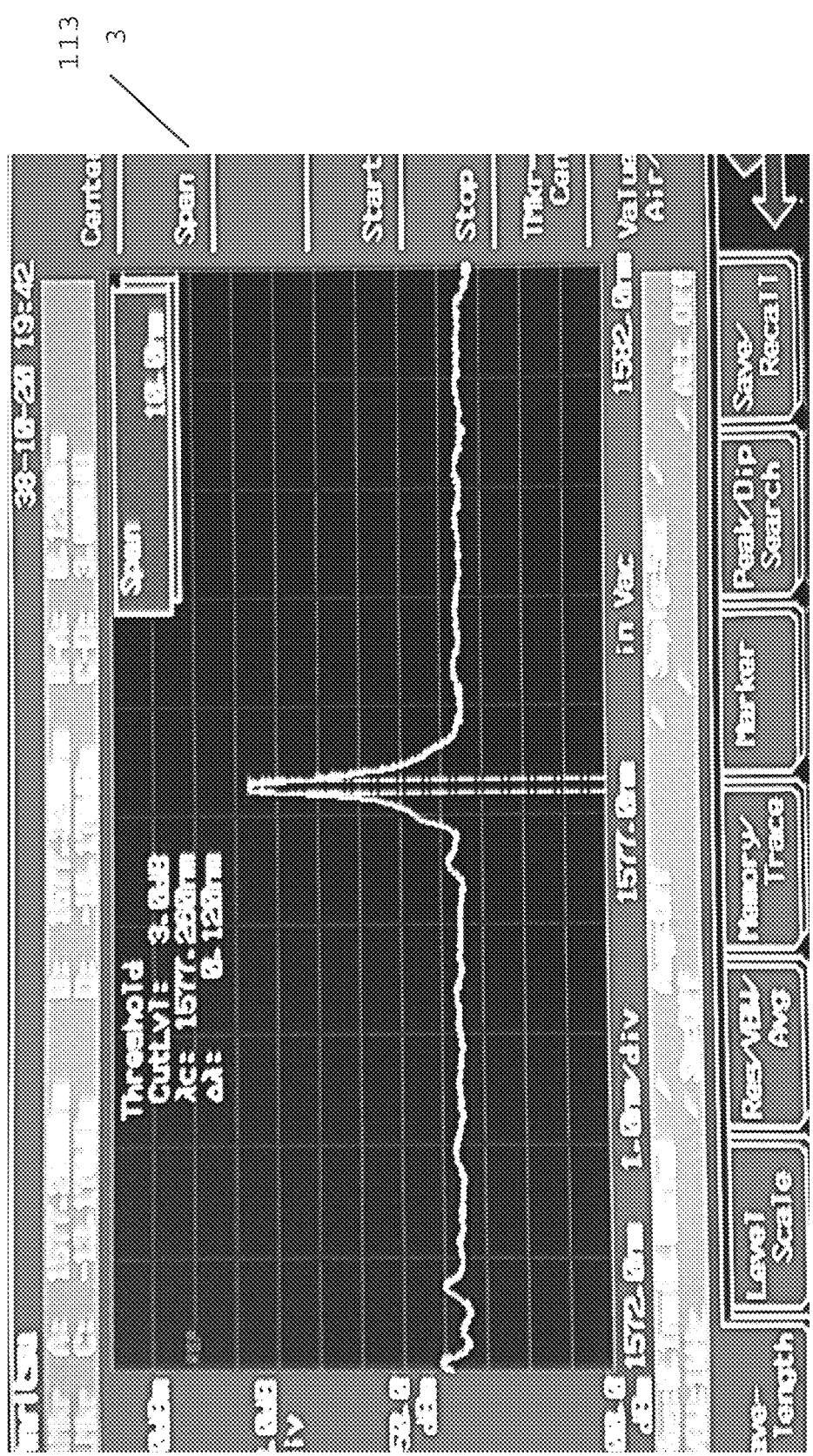

By way of example, FIG. 8A illustrates laser current and temperature settings from GUI control 831 for a temperature value of 23° C. with laser mirror current adaptation enabled, and FIG. 8B shows its corresponding optical spectrum output 833. FIG. 9A illustrates laser current and temperature settings from GUI control 931 for a temperature value of 30° C. without laser mirror current adaptation, and FIG. 9B shows its corresponding optical spectrum output 933. FIG. 10A illustrates laser current and temperature settings from GUI control 1031 for a temperature value of 30° C. with laser mirror current adaptation enabled, and FIG. 10B shows its corresponding optical spectrum output 1033. FIG. 11A illustrates laser current and temperature settings from GUI control 1131 for a temperature value of 40° C. with laser mirror current adaptation enabled, and FIG. 11B shows its corresponding optical spectrum output 1133.

As noted, for the temperature values of 23° C. and 40° C. is shown only with the current correction function enabled, whereas for 30° C. is shown laser current settings and example spectra both with and without the current correction. In the case of 30° C., it is noted that the optical spectrum output is centered at 1577.160 nm with laser mirror current adaptation enabled, while the optical spectrum output is centered at 1578.040 nm without laser mirror current adaptation enabled. As such, the present disclosure may provide the operator at a remote location (e.g., at a host device) with enhanced capability to control various parameter settings of the tunable laser, as well as operational parameters relating to one or more processes concurrently running in the field programmable device, via the one or more GUIs as shown in FIGS. 8A, 9A, 10A, and 11A.

Linewidth Reduction Algorithm—Digital Signal Processing

In an aspect of the present disclosure, a linewidth reduction algorithm may be digitally implemented as a concurrent, independent module or process in the field programmable device 103 or 531, such as the FPGA, PLD, or the like. By way of example, the linewidth reduction algorithm, such as the Pound-Drever-Hall (PDH) technique is a widely used and powerful approach for stabilizing the frequency of light from tunable lasers by locking to a stable cavity. The range of applications for the PDH technique is broad and may include interferometric gravitational wave detectors, atomic physics, and time measurement standards, many of which also use related techniques such as frequency modulation spectroscopy.

Figure 12:
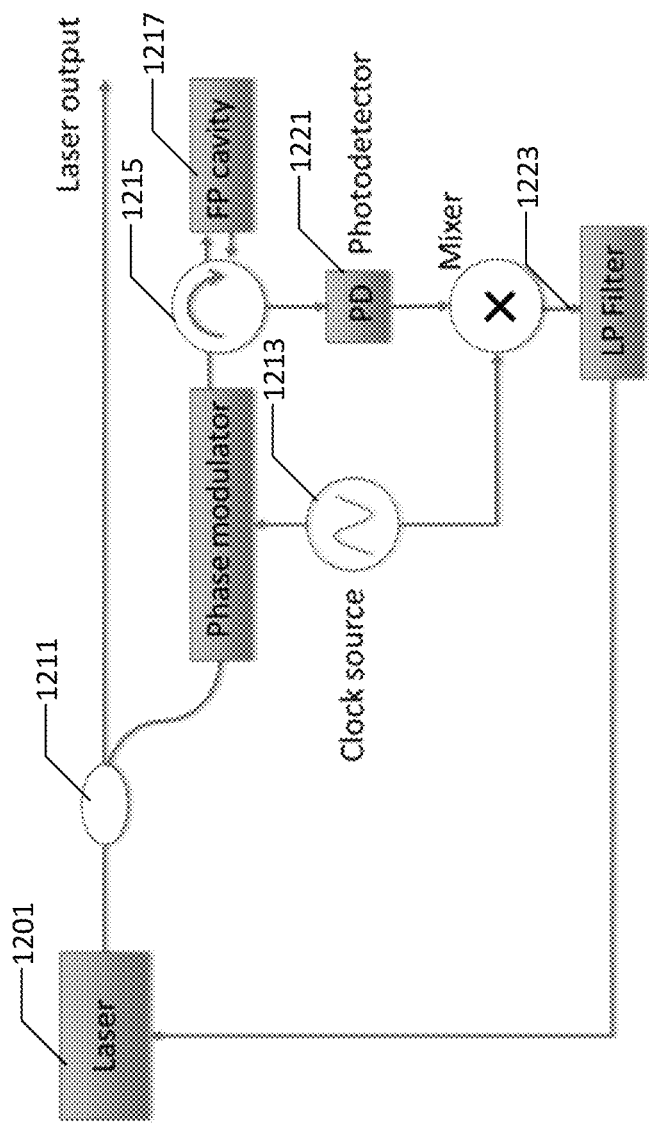
FIG. 12 illustrates a typical implementation of an analog PDH control system.

FIG. 12 illustrates a typical implementation of an analog PDH control system. The emitted light from a laser 1201 is split by a splitter 1211 by some ratio and a part is phase modulated using an external clock source 1213. The phase modulated signal is sent through a circulator 1215 and to a Fabry-Perot filter 1217, and the reflected light from the Fabry-Perot filter 1217 is detected by a photodetector 1221 and subsequently mixed with an original clock source signal to generate an error signal 1223. The error signal 1223 is then signal processed and used on the laser to rectify phase aberrations, thus reducing its linewidth. As noted, in an aspect of the present disclosure, a PDH feedback loop may be implemented as a concurrent, independent module or process in the field programmable device for high bit rate coherent communications as shown in FIG. 13.

Figure 13:
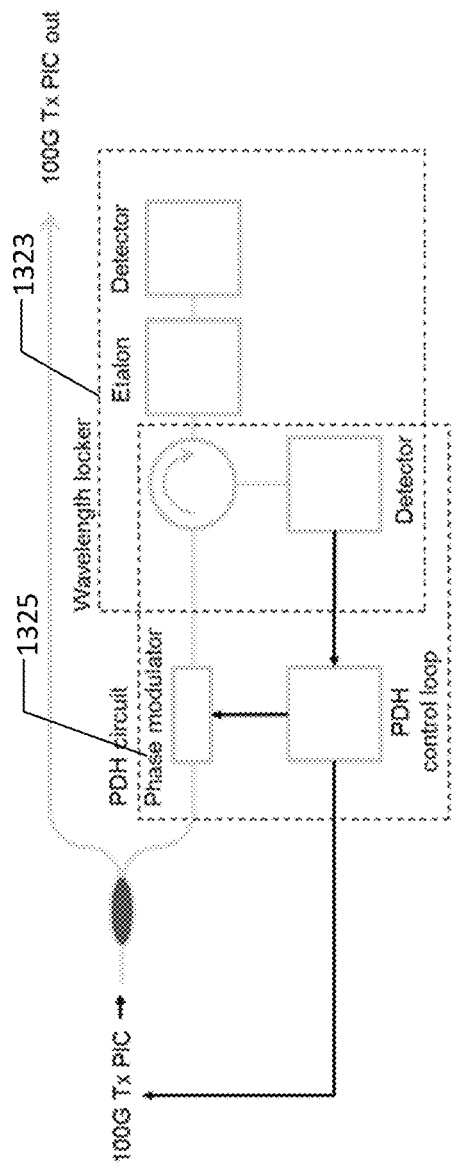
FIG. 13 illustrates an example implementation of a PDH feedback loop in accordance with an aspect of the present disclosure.

In an aspect of the present disclosure, an example of a system with a 100 Gbps transmitter using a wavelength locker system as an optical detection system is illustrated in FIG. 13. The advantages of the present disclosure for linewidth narrowing or reduction, required for coherent communications and other high bit rate communications (and spectrally efficient communications systems), may include that the control circuitry may be implemented as a concurrent, independent module or process in the field programmable device 103 or 531, such as the FPGA, PLD or the like, running at a clock speed independent of other control loop processes and optimized for a desired linewidth. Additionally, in one implementation, the same optics, optoelectronics, analog electronics and analog-to-digital circuits used for other purposes, e.g., a wavelength locker 1323, may also be dual used for the linewidth narrowing, e.g., PHD circuit 1325, thereby reducing the cost, complexity, size, weight and power of a low linewidth transceiver or transmitter, which may be implemented in accordance with an aspect of the present disclosure. Using the present technology described herein, thus, all of the building blocks of the analog PDH control system illustrated in FIG. 12 may be implemented in reprogrammable hardware gates of the field programmable device 103 or 531. An illustration of a PDH linewidth control system that re-uses (dual use) wavelength locker components is shown in FIG. 13 with the PIC, external components and the PDH control loop.

Traditionally, PDH algorithms use analog electronics to form the filtering, demodulation and feedback portions of a noise reduction loop. These functions may be problematic to perform in a microprocessor or a microcontroller, due to certain requirements for fixed low latency in a path from a detector to a laser phase modulator. However, advantages of the present technology may provide that the field programmable device 103 Or 531 enables implementations of digital signal processing (DSP) functions as fixed, dedicated modules or processes, allowing precise control of latency. As such, the implementation of the PDH feedback loop in accordance with the present disclosure may result in immunity from analog noise and electronic magnetic interference (EMI) sources and programmability which greatly simplifies calibration and optimization of feedback loop characteristics and linewidth reduction performance.

Figure 14:
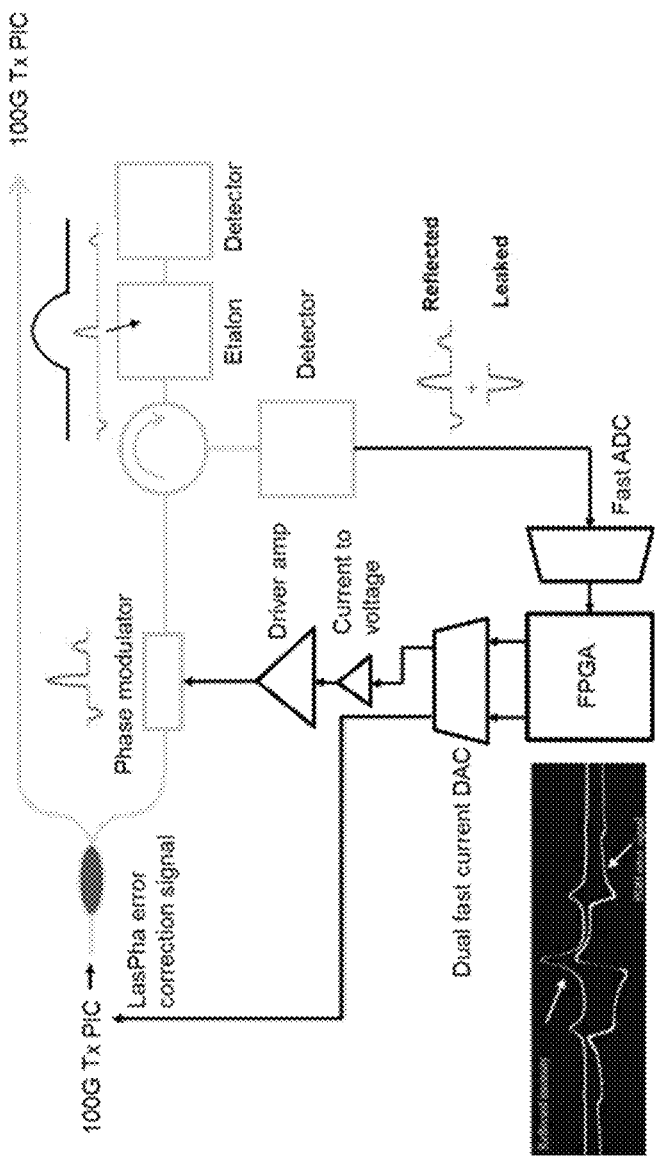
FIG. 14 illustrates an example implementation of a PDH algorithm in accordance with an aspect of the present disclosure.
Figure 15:
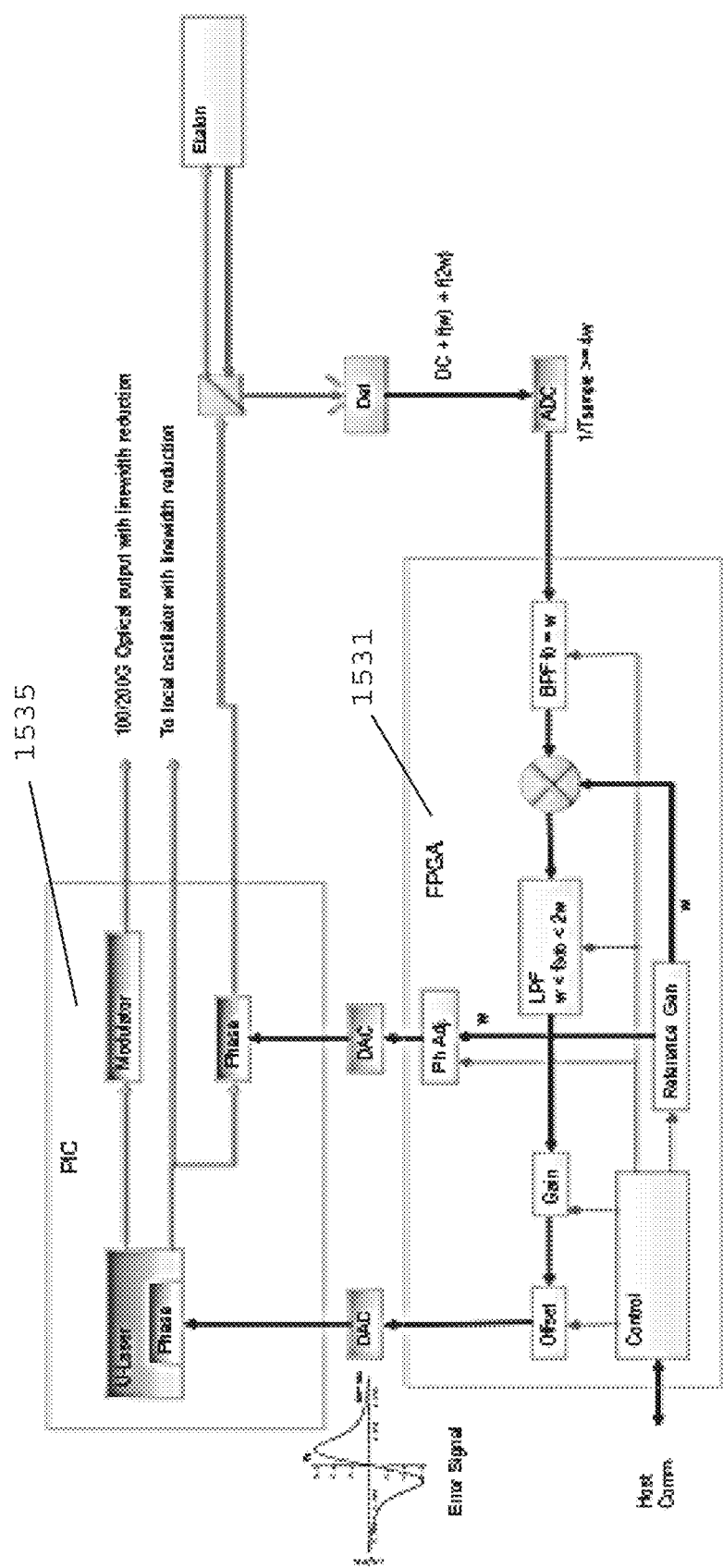
FIG. 15 illustrates an example implementation of the PDH algorithm in accordance with an aspect of the present disclosure.

FIG. 14 shows an example block diagram illustrating one embodiment showing connections of a field programmable device (e.g., FPGA or PLD or the like) to ADC, DACs, laser and optical path, in accordance with an aspect of the present disclosure. FIG. 15 shows an example block diagram illustrating implementation of filtering function(s) embedded in a field programmable device for the PDH loop, in accordance with an aspect of the present disclosure. In the example, the detected optical power from a reflected etalon optical path is digitized and fed into the field programmable device such as an FPGA 1531, which is configured to perform the PDH algorithm filtering, demodulation, and produce an error cancellation signal that drives the laser phase modulator in a photonic integrated circuit (PIC) 1535. The FPGA 1531 is also configured to produce a reference modulation frequency that drives an etalon input optical signal phase modulator through a DAC, as shown in FIG. 15.

Figure 16:
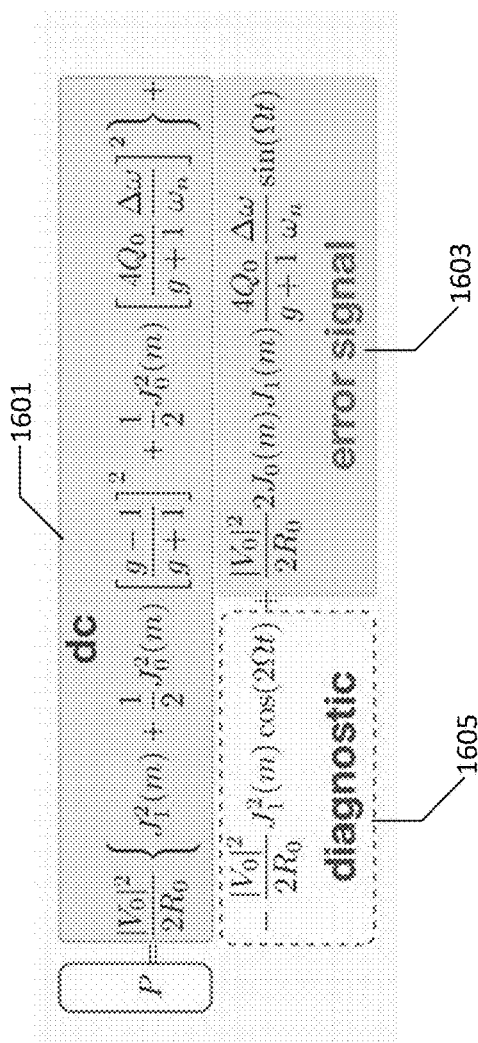
FIG. 16 shows an example of an equation for detected power from an etalon reflected optical signal in accordance with an aspect of the present disclosure.

In another aspect of the present disclosure, in the example of FIG. 15, an equation for the detected power from the etalon reflected optical signal, represented as a function of a difference between the reference modulation frequency and a representative unwanted frequency component may be derived and used, as shown in FIG. 16. In the equation, the detected power (P) includes three components, a DC term 1601, a component at a modulation frequency (error signal 1603), and a component at twice the modulation frequency (diagnostic 1605). The component at twice (2×) the modulation frequency (diagnostic 1605) may be used for test and calibration of a system. In an example implementation of the PDH algorithm, through modulating a laser wavelength such that side lobes occur on a highly sloped portion of a resonator response, an amplitude of the component at the modulation frequency (error signal 1603) is proportional to a difference between any extraneous frequency components and the modulation frequency, and responds oppositely to positive and negative phase perturbations, thus producing a desired error signal.

Figure 17:
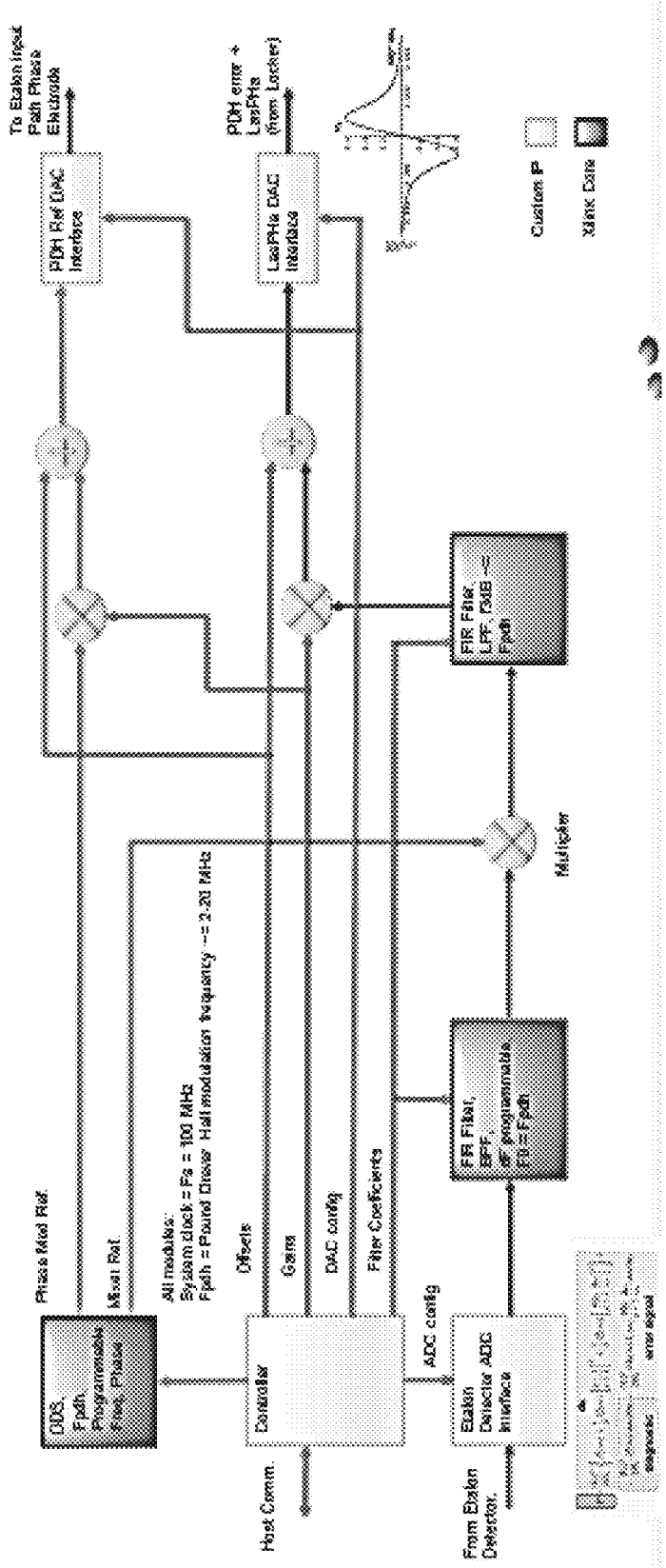
FIG. 17 illustrates an example implementation of the PDH algorithm in accordance with an aspect of the present disclosure.

Further, in one implementation of the PDH algorithm, the error signal may be extracted and fed back to the phase modulator in the tunable laser to cancel undesired components as shown in FIG. 17. Here, ADC interface logic receives a digitized power signal from the etalon reflected optical path detector. A digital FIR band pass filter centered at the modulation frequency removes the DC component and 2× modulation frequency components from the detected power signal. The band pass output is then multiplied by the modulation frequency reference, which is generated by a DDS. The result is a demodulated error signal with a component at 2× modulation frequency which is unwanted. As a result, a FIR low pass filter with cutoff at about the modulation frequency removes the unwanted 2× modulation frequency component, while leaving any error components up to the modulation frequency.

The resulting error signal goes through gain and offset blocks to provide proper amplitude and DC offset to drive the laser phase modulator, and then goes to the DAC interface logic which formats the data and sends it to the DAC. The design latency in the example path shown between the detected power from the etalon and the laser phase electrode, including the external ADC and DAC is less than 500 ns, the main contribution being from the FIR filters. Optimization of the foregoing algorithm may result in even lower latency. The reference DDS provides phase adjustment of the modulator reference signals sent to both the demodulator and the reference phase modulator such that the response can be nulled for initial calibration. Gain and offset adjustment are also provided for the reference modulation output. FIR filter coefficients, reference frequency and phase, gains, and offsets are all programmable by the host, enabling ease of algorithm optimization, tuning and calibration of the tunable laser and it associated systems. As such, in an aspect of the present disclosure, the linewidth reduction algorithm may be digitally implemented as a concurrent, independent module or process in the field programmable device 103 or 531, such as the FPGA, PLD, or the like.

Real-time Monitoring of Parameters

Many parameters in a tunable laser/modulator require real time monitoring and feedback to dynamic control loops. Parameters also require measurement at many operating points for calibration and analysis purposes, and the speed with which these measurements can be performed may be critical to enabling large scale production of tunable lasers.

In an aspect of the present disclosure, the present technology enables such large scale production of tunable lasers. In other words, parallel architectures that may be created using field programmable devices, such as FPGAs or PLDs or the like, enable monitoring of the critical parameters and feed them back to multiple control loops simultaneously with minimal latency, whereas a microprocessor or microcontroller would have to process and distribute all of the information in a serial and/or sequential manner.

As noted above, a field programmable device-centric implementation (e.g., FPGA/PLD-centric implementation) may be described as one embodiment of the present disclosure. Of parameter monitoring, the field programmable device (103, 531, etc.) may be configured to control read cycles to a plurality of ADC channels, e.g., 24 ADC channels, such that the channel reads occur with minimal overhead and yet are fully programmable as to sequence and frequency per channel. This aspect of the present disclosure may enable monitoring of parameters critical to real time control loops with frequencies high enough to provide data for real time controls, such as wavelength locking, power control and temperature control. Table 1 below lists some of the real-time controls as well as calibration algorithms with representative parameters that need to be monitored for each and sample rates.

TABLE 1

Real-time Controls and Functions with Representative Parameters

| Function | Parameters | Sample Rates |
| --- | --- | --- |
| Wavelength Locking | Output Power | 1 KHz |
| | Etalon Transmitted Power | 1 KHz |
| | Etalon Reflected Power | 1 KHz |
| Automatic Power Control | Output Power | 100 Hz |
| | MZM Output 1 Power | 100 Hz |
| | MZM Output 2 Power | 100 Hz |
| Temperature Control | Thermistor Voltage | 10 Hz |
| Linewidth Reduction | Etalon Reflected Power | 20 MHz |
| | Etalon Transmitted Power | 1 KHz |
| Wavelength Calibration | Laser Gain Voltage | 1 KHz |
| | SOA1 Voltage | 1 KHz |
| | SOA2 Voltage | 1 KHz |
| Modulator Calibration | MZM Output 1 Power | 5 KHz |
| | MZM Output 2 Power | 5 KHz |
| | Mod Bias P Voltage | 5 KHz |
| | Mod Bias N Voltage | 5 KHz |

As can be seen from Table 1 above, two things may be noted: (i) some parameters need to be sourced by more than one function; and (ii) some parameters need to be sampled much faster than others. Thus, one or more implementations based on field programmable devices, in accordance with aspects of the present disclosure, may allow the flexibility to architect the monitoring functions in a way that maximizes efficiency and allows all processes to obtain required data at sufficient rates simultaneously.

Figure 18:
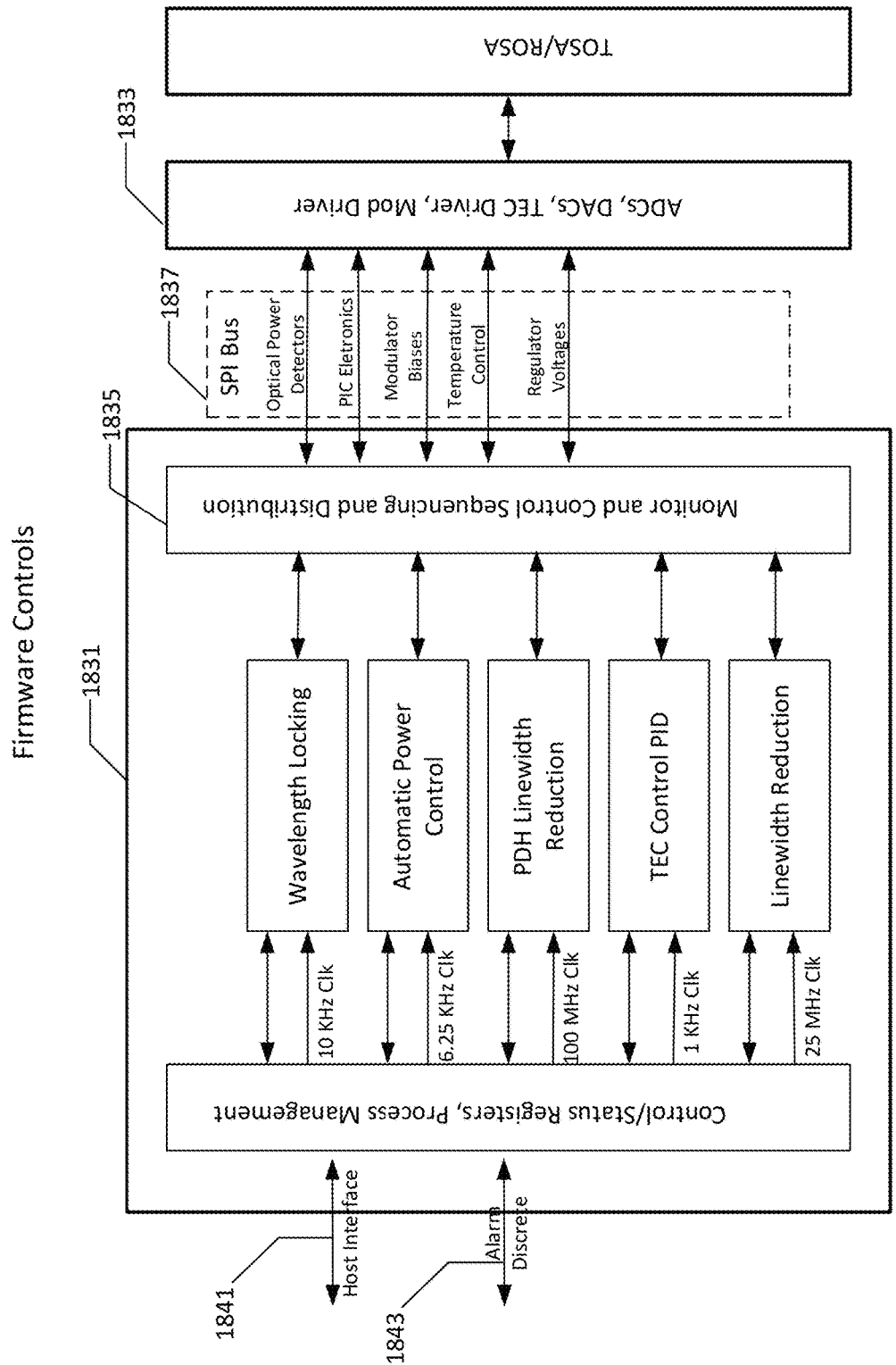
FIG. 18 illustrates an example block diagram of firmware control of a field programmable device and other devices in accordance with an aspect of the present disclosure.

FIG. 18, for example, illustrates an example block diagram of firmware control of a field programmable device 1831, e.g., FPGA/PLD firmware, and attached ADCs and DACs 1833 that are used for monitoring parameters. In the example, all real time control loops may be configured to run in parallel with independent rates, e.g., independent clock rates (for example, 10 Khz, 6.25 Khz, 100 Mhz, 1 Khz, and 20 Mhz in FIG. 18). Parameters required by the real time control loops may be supplied by monitor and control logic 1835, which may be configured to access parameters through one or more SPI busses 1837 interfaced to ADCs, DACs and other devices. Further, the field programmable device 1831, e.g., FPGA, PLD, or the like, is configured to allow creating multiple SPI interfaces, each with different protocols, for devices that need high priority access, while also maximizing bandwidth and running with near-zero overhead on the SPI interfaces shared by multiple devices. Furthermore, the parameters required by multiple control loops may be distributed simultaneously to all required functions, and the parameters that are required with high bandwidth by some functions but not others may be supplied from multiple monitoring devices, as required.

As a result, in an aspect of the present disclosure, the real time control functions may be implemented in the field programmable device 1831 as one or more concurrent, independent processes in the field programmable device 1831, and thus may be used to analyze the parameters received from the monitor and control logic 1835 and generate alarms and status which are fed back to a host via a host or register interface 1841 and/or discrete 1843. Further, in the example, the generated alarms may include: (i) laser temperature yellow and red alarms; (ii) laser power yellow and red alarms; (iii) laser on; and (iv) lambda stable. Further, in another aspect, the field programmable device 1831 may also allow the calculations and decision processes for alarms to run in parallel, minimizing the latency of reporting anomalous conditions to the host.

Wavelength Locking

A wavelength locking algorithm dynamically tunes a laser wavelength to maintain it at a precise set point over variations in operating conditions based on a response of a Fabry-Perot etalon. Typically, the etalon has peak responses at wavelengths and intervals coincident with standard ITU specifications, but in principle the wavelengths could be at any value or interval, depending on the design of the etalon.

Figure 19:
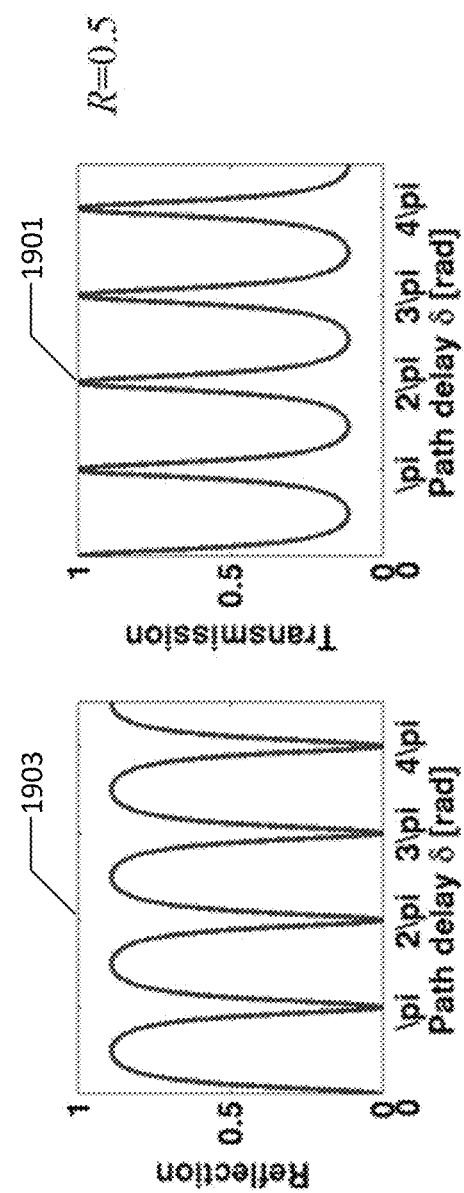
FIG. 19 illustrates an example of general etalon reflected and transmitted responses in accordance with an aspect of the present disclosure.

FIG. 19 shows an example of general etalon reflected and transmitted responses. The transmitted response 1901 has peaks at the wavelengths of interest, whereas the reflected response 1903 has minima at these same wavelengths. In order to create an etalon geometry physically small enough to be placed with other optics in a pluggable module, compromises may be made on the finesse, or sharpness of the etalon maxima and minima, lessening the precision with which wavelength locking may be performed. In an aspect of the present disclosure, efficient measurement of etalon response and algorithmic processing of the measurements are enabled to improve the quality of the results.

In order to find the etalon peak and/or minimum corresponding to a desired operating wavelength, the laser is first tuned to near a correct wavelength by tuning the mirrors based on a pre-calibrated table of mirror current values and corresponding wavelengths. The wavelength locking algorithm then fine-tunes the wavelength by dithering a laser phase electrode current over a small range about a default pre-calibrated value and searching for peak and/or minimum response. The algorithm may be performed digitally by controlling a current DAC that drives the laser phase electrode, and monitoring the etalon response through ADCs.

Figure 20:
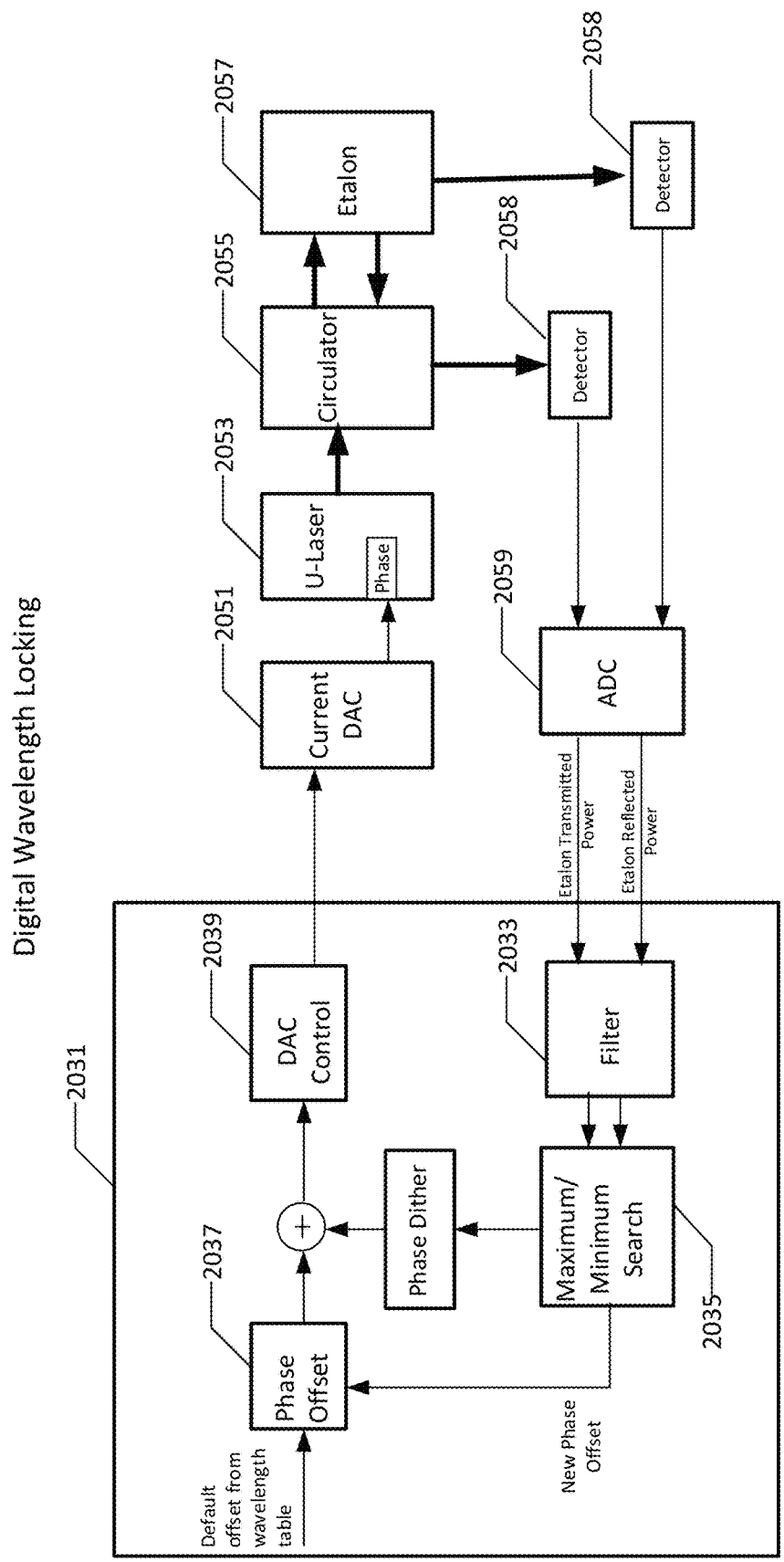
FIG. 20 illustrates an example of a block diagram illustrating an example implementation of a wavelength locking algorithm, in accordance with an aspect of the present disclosure.

FIG. 20 shows an example of a block diagram illustrating another implementation of a wavelength locking algorithm, in accordance with an aspect of the present disclosure. Here, the wavelength locking algorithm is performed digitally by controlling a current DAC 2051 that drives the laser phase electrode, and monitoring the etalon response through ADCs 2051. In the example implementation, a phase dithering speed may be a compromise between obtaining updates to a phase offset, and hence an operating wavelength, at a sufficient rate, minimizing linewidth effects of the dithering. The example technique may step the phase at a 100 us rate. The amplitude of the dithering may also be a compromise between scanning over a wide enough range to capture the maximum/minimum and not scanning so far as to perpetuate a mode hop in the laser 2053. The scan amplitude (or range) in the example implementation may be programmable and may be set per wavelength based on calibration tables, but is generally in a range of +/−1 mA of phase electrode current.

In an aspect, the detected etalon transmitted and reflected powers (via detectors 2058 coupled to a circulator 2055 and a etalon 2057) received from the ADC 2059 are then processed through an averaging filter 2033 to reduce noise and smooth the response. The field programmable device 2031 such as the FPGA, PLD or the like is configured to facilitate filtering the transmitted and reflected power data in parallel. The algorithm then attempts to find a maximum in the transmitted data and a corresponding minimum in the reflected data, via a maximum/minimum search 2035, based on finding the maximum/minimum value over a data set and verifying that it is in fact an inflection point by requiring a threshold exceedance above/below the minimum/maximum at points on both sides of the minimum/maximum in the scan. The average of the determined maximum and minimum points is then used as a new phase offset to be applied to the laser 2053 to set a fine adjustment of the wavelength. If the algorithm fails to find an acceptable minimum or maximum, the new phase offset will be based on the inflection point successfully determined, or if neither a minimum nor maximum is determined, the data for the current scan is not used and the phase is not changed until a successful scan is obtained. The new phase offset is provided to a phase offset 2037 and to the laser 2053 via a DAC control 2039 and a current DAC 2051. Further, it is noted that the above wavelength locking algorithm may be implemented as one or more concurrent, independent processes in the field programmable device (103, 531, or the like), such as the FPGA, PLD or the like.

Further, it is noted that phase modulation may be needed to achieve at least one or more of the following: (i) wavelength locking, (ii) linewidth reduction; and (iii) Brillioun scattering mitigation. By way of example, in the one implementation, the laser wavelength is tuned under control of the field programmable device such as the FPGA or PLD or the like, via a multi-channel current DAC driving the laser electrodes, interfaced via SPI. The initial mirror and phase electrode currents for a commanded wavelength may be set via a lookup table, and a wavelength locking control loop may run continuously based on detected etalon power to maintain wavelength stability. As such, the field programmable device (e.g., FPGA, PLD, or the like) based implementation of real time control algorithms facilitates enhancements and optimization, as individual control loops can be tuned independently without impacting overall system performance and timeline.

Temperature Control

Figure 21:
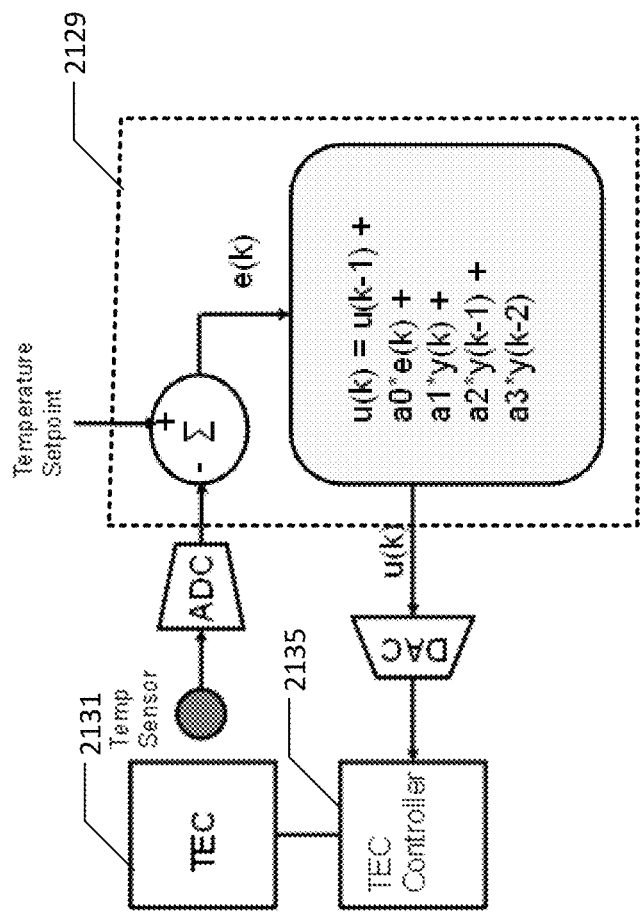
FIG. 21 illustrates an example diagram of one implementation of a temperature control process in accordance with an aspect of the present disclosure.

In another aspect of the present disclosure, a process for temperature control of a tunable laser may be implemented as a concurrent, independent process in the field programmable device (e.g., FPGA/PLD) which is configured to run at a different clock signal from other processes. FIG. 21 illustrates an example diagram of one implementation of the temperature control process. By way of example, a module 2129 (e.g., temp_pid) monitors and controls an attached TEC 2131 through a TEC controller 2135 using a discrete PID loop. It may be configured to accept desired temperature as an input and servos at a settable sample rate (the time constant) until the TEC actual temperature is the same as the set temperature.

The module 2129 (e.g., temp_pid) monitors the TEC temperature, comparing it to the set temperature (e.g., temperature setpoint) and adjusting the TEC drive current to achieve the desired temperature. The TEC 2131 may be controlled through a linear control chip. As such, temperatures may be monitored via localized thermistors and selected ADC channel(s). TEC drive current may also be monitored via the linear control chip and selected ADC channel(s). TEC drive current may also be computed based on a PID loop output, the set temperature, and an actual TEC temperature. The PID loop output thus drives a selected DAC channel which determines the controller output current.

As noted above, the module 2129 (e.g., temp_pid) is configured to monitor and control an attached TEC 2131 through a TEC controller circuit 2135. The module 2129 may be configured to accept a desired temperature value as an input and servos at a settable rate (the time constant) until TEC actual temperature becomes the same as the set temperature. Maximum TEC current as well as maximum and minimum temperature may also be monitored for alarm conditions which are indicated with red and yellow alarm outputs. The algorithm used for the servo may include a PID loop using the following discrete time domain formula:

$$u(k)=u(k-1)+a0*e(k)+a1*y(k)+a2*y(k-1)+a3*y(k-2),$$

where u(k) is the output, u(k−1) is the previously computed output, e(k) is the difference between the set temperature and actual temperature, y(k), y(k−1), y(k−2) are the one and two sample delayed input temperature from TEC controller.

Also, values a0, a1, a2, a3 may be derived from the PID coefficients Kp, Ki, Kd and the sample period Ts as follows:

$$a0=Ki*Ts,$$

$$a1=Kp-(Kd/Ts),$$

$$a2=Kp+(2Kd/Ts),$$

$$a3=-Kd/Ts.$$

The structure of the ALU used to generate u(k) may consist of a 16×16 multiplier with a 4:1×16 mux on each input followed by a 36 bit summer with an accumulator register. A 16 bit substractor block produces the e(k) value. u(k) and u(k−1) are range checked and limited to ד1000" to avoid windup or overflow. The accumulator becomes the u(k−1) value for the next iteration. The input mux and multiplier and the ALU are all pipelined and it may take 2 clocks for the first product and sum and one clock each for the subsequent 3 multiply-and-adds. The accumulator then may hold u(k), which is u(k−1) for the next cycle.

In an aspect of the present disclosure, there may be two indicators of errors: a red alarm and a yellow alarm. A red alarm may indicate that either a maximum temperature, current, or temperature margin has been exceeded. After an initial period of suppressing the TEC shutdown, if a red alarm occurs to allow the PID loop time to achieve the set temperature, a red alarm will cause a TEC shutdown and a laser shutdown. There may be a plurality of procedures as follows:

TEC_init_proc: When TEC is initially enabled, red alarm shutdown is suppressed for a period of time proportional to the sample period, but no less than about 5.8 seconds.

Temp_control: Sets and monitors alarm limits, current limits, and PID limits.

PID_proc: A finite state machine (FSM) that controls PID ALU initialization and sequencing of PID ALU.

Pid_mpy_inst: An instance of an embedded parallel signed 16×16 multiplier with a synchronizing 32 bit output register. It may be part of the PID ALU.

Local_CLK_Proc: Programmable sample clock generator in increments of 100 uS.

Further, in an aspect of the present disclosure, the PID constants and sample period may be estimating and set. The PID constants may be estimated using a Ziegler-Nichols method, which may require knowledge of a frequency at which the control loop will oscillate given sufficient gains without differential or integral terms. Further, due to safety limits imposed on the design, it may not be possible to obtain this value which requires steady state oscillation. Instead, Tu may be estimated from a damped oscillation period and Ku may be estimated.

In an aspect of the present disclosure, a simple first order model of the TEC (a single coefficient low pass filter) and the PID servo may be created in a spreadsheet with the discrete coefficients, a0-a3 derived from the PID values. A step change in a set point for the temperature may generate a step response of the loop with the selected PID constants, Kp, Ki, and Kd, and the sample period Ts and the model transfer coefficient, "xfer_coeff". The response may be graphed so that the results may be viewed interactively. Actual coefficient inputs to the PID module may also be multiplied by 128, allowing for a binary point at bit 6 and fractional coefficients. Additionally, the Ziegler-Nichols table may be implemented to give staring values for the PID constants given the estimates of Ku and Tu.

Further, there may be two panes in a spreadsheet for computing variables. The first pane may be used to discover Ku and Tu interactively; the second pane may be used to interactively develop optimal Kp and Ki for the SFP (the differential term has been set to zero). Further, in an aspect of the present disclosure, the Ziegler-Nichols method may assign PID coefficients based on experimental data or simulated plant behavior using the following technique:

Set the Ki and Kd coefficients to zero.

Increase the Kp (gain) coefficient until the loop oscillates with a constant amplitude.

Note the period of oscillation—this is Tu in the table below.

Note the Kp gain value—this is Ku, the ultimate gain in the table below.

| control type | Kp | Ki | Kd |
| --- | --- | --- | --- |
| P | 0.5Ku | | |
| PI | 0.45Ku | 1.2Kp/Tu | |
| PD | 0.8Ku | | KpTu/2 |
| PID | 0.6Ku | 2Kp/Tu | KpTu/8 |
| Pessen Integral | 0.7Ku | 2.5Kp/Tu | 0.15KpTu |
| some overshoot | 0.33Ku | 2Kp/Tu | KpTu/3 |
| no overshoot | 0.2Ku | 2Kp/Tu | KpTu/3 |

Note that the spreadsheet "Ku, Tu" worksheet may be used to find the Ku and then Tu values after the sample rate and first order filter coefficient are selected.

Boxcar Filter

In an aspect of the present disclosure, one or more multichannel moving average (also known as "boxcar") filters may be digitally implemented in the field programmable device (e.g., FPGA or PLD), which may be configured to provide configurable low pass filtering for each of 24 ADC channels in the 10G TOSA electronics board, for example. Each of the 24 channels may be set to a different filter depth of 0, 1, 2, 4, 8, 16, 32, 64, 128, or 256 samples. This capability may enable filtering of ADC output data where needed for short term fluctuations or random higher frequency noise. Filter depth and enable may also be programmed through a set of channel number associated registers in the register memory space. Before filtered output is determined to be valid, the sample memory for a given filter channel must be full of samples. As such, in one implementation, as the samples are taken, a sum of all the samples and the new sample minus the oldest sample may be averaged and presented as an output value of the filter.

Figure 22:
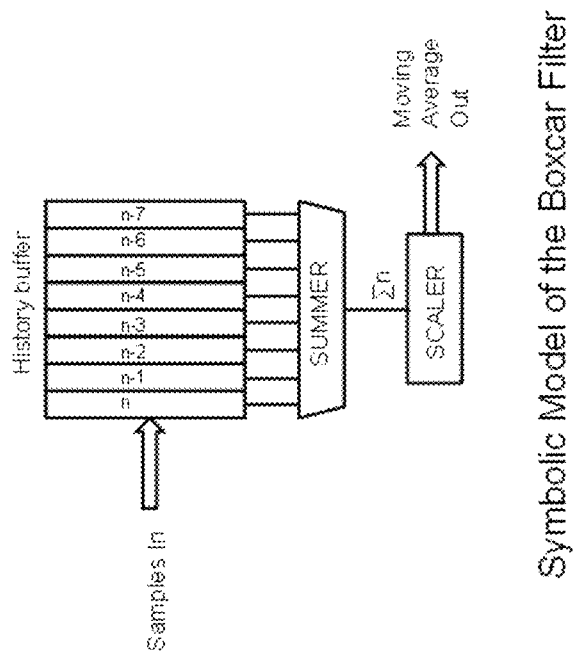
FIG. 22 illustrates a block diagram of a symbolic model of one channel of the boxcar filter in accordance with an aspect of the present disclosure.

In an aspect of the present disclosure, one or more boxcar filters may be implemented using internal memory blocks of the field programmable device (e.g., FPGA or PLD) for data history storage, addressing and indexing, and accumulating sums for each channel. By way of example, a single 24-bit ALU in the field programmable device may be used for data summing and sums may be shifted right a number of positions appropriate for the depth of each filter. In one implementation, it may take approximately 10 system clock times from input to output (about 400 ns). Since a sample rate of an associated analog subsystem may be about 4 KHz/channel, the boxcar filter may easily accommodate all channels while adding very little delay time. A block diagram for a symbolic model of one channel of the boxcar filter is shown in FIG. 22.

Non-Volatile Memory Storage

Figures 23A, 23B:
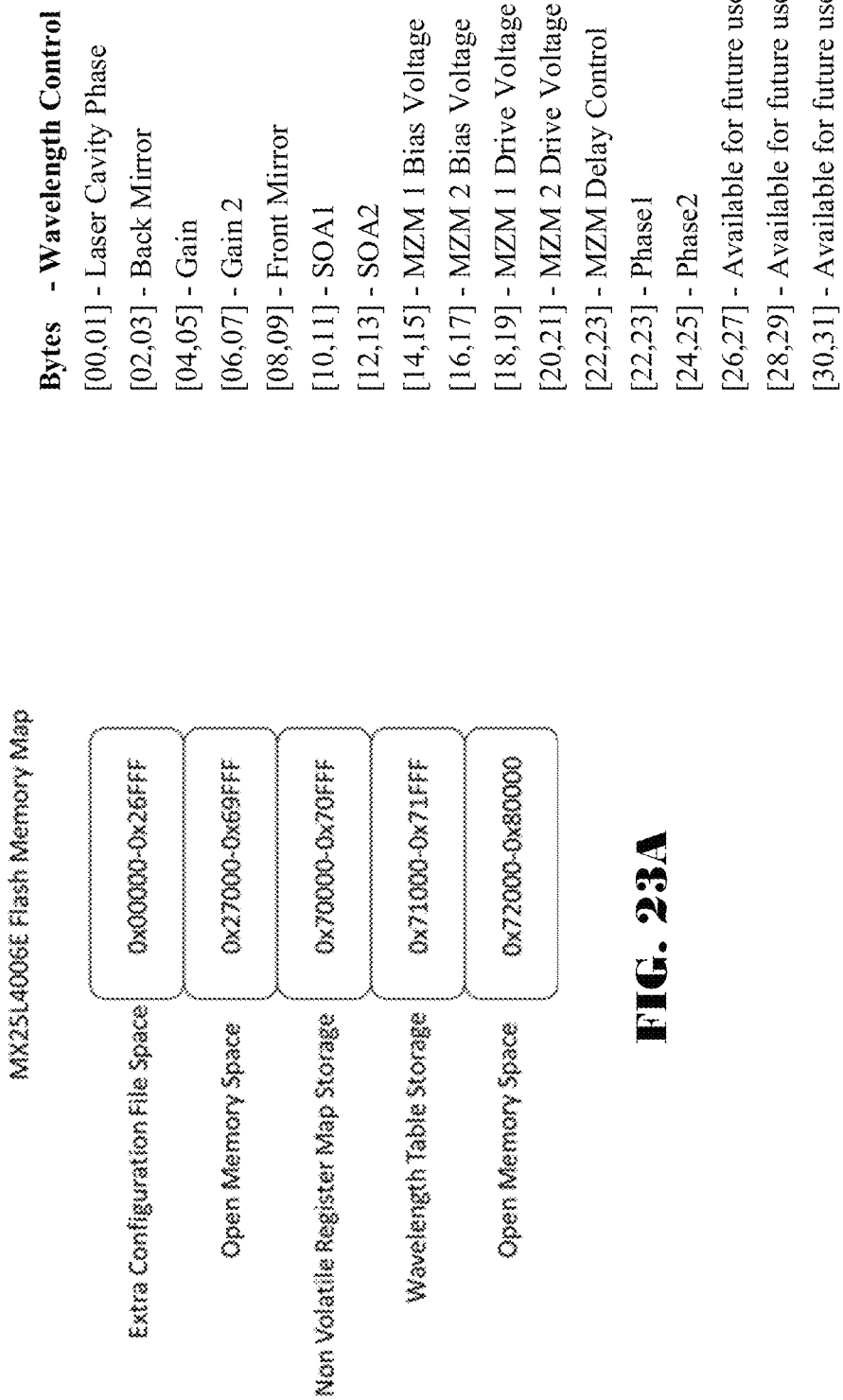
FIG. 23A illustrates an example address spacing of a flash memory in accordance with an aspect of the present disclosure.
FIG. 23B illustrates an example of a wavelength definition table in accordance with an aspect of the present disclosure.

In an aspect of the present disclosure, a state of the registered memory map as well as device wavelength tables may be stored in one or more non-volatile flash memories (e.g., a Mcronix flash memory, MX25L4006E). Each flash memory may be a 4 Mb capacity device and may be integral during the power-up of the device to apply the proper personality and in maintaining end user defined behavior of an entire system. There may be a set of registers which when written to, cause an immediate writing of that byte to the flash. Therefore, when power is cycled, that byte data may persist, maintaining the user defined personality. An example of the address space of the non-volatile flash memory may be defined as shown in FIG. 23A. Also, a wavelength definition table may be defined as shown in FIG. 23B. Each wavelength table may be a 32 byte structure, and each device may include storage space for a number of wavelength tables, whether internal or external to the field programmable device.

Power-Up Flash Procedures to Populate Registers and Wavelength Tables

In an aspect of the present disclosure, upon power up of an optical communication system or a device, on board firmware personality may undergo two procedures in order to place the device in a state determined by an end user. For example, the procedures may include a loading of the registered memory map into a firmware system and a copying of the wavelength tables into RAM storage of the communication system. Each of the memory spaces may be defined as 4096 bytes (4 KB). As shown in the flash memory map in FIG. 23A, the register memory map may begin at 0x70000. Upon the power up, the first procedure performed by the on board firmware personality is to copy the register values into the firmware register space. The second procedure performed is the copying of the wavelength tables from the flash beginning at 0x71000 into the wavelength RAM space on the device. Once all of the memory has been copied from the flash, the register value for a "current wavelength" is read by the device, and that wavelength is written to the laser electrode registers. At this point, the device may be fully powered up and configured, with the selected wavelength loaded and ready for operation. In the implementation, it may take approximately 0.4 ms to copy all of the register and wavelength data from the flash storage device.

Applications Programming Interface (API)

In an aspect of the present disclosure, the Applications Programming Interface (API) may be implemented by DLL executable libraries. By importing the API DLLs into a coding project, a user of the API may have access to functions that control a tunable laser control electronics. The API functions available to the user may allow one to properly open a serial communications port, read and write to the register interface, and even provide some higher level macro functions to directly read the device temperature, set electrode currents, read monitor voltages, set a wavelength, and turn the laser and laser TEC on and off. As such, the present disclosure may provide software-enabled features accessible via the APIs, offering extensive real-time control and monitoring of one or more modules or processes based on, for example, actual traffic flows. As noted, such programmability provides an unprecedented level of flexibility and responsiveness at an optical layer with real-time scaling and rerouting of a bandwidth, a higher bandwidth extraction from a given fiber plant as well as a reduction in complexity and related cost of planning, building, operating and maintaining data networks.

While the foregoing written description of the present disclosure enables one of ordinary skill to make and use what is considered presently to be the best mode thereof, those of ordinary skill will understand and appreciate the existence of variations, combinations, and equivalents of the specific embodiment, method, and examples herein. The present disclosure should therefore not be limited by the above described embodiment, method, and examples, but by all embodiments and methods within the scope and spirit of the present disclosure.

Figure 24:
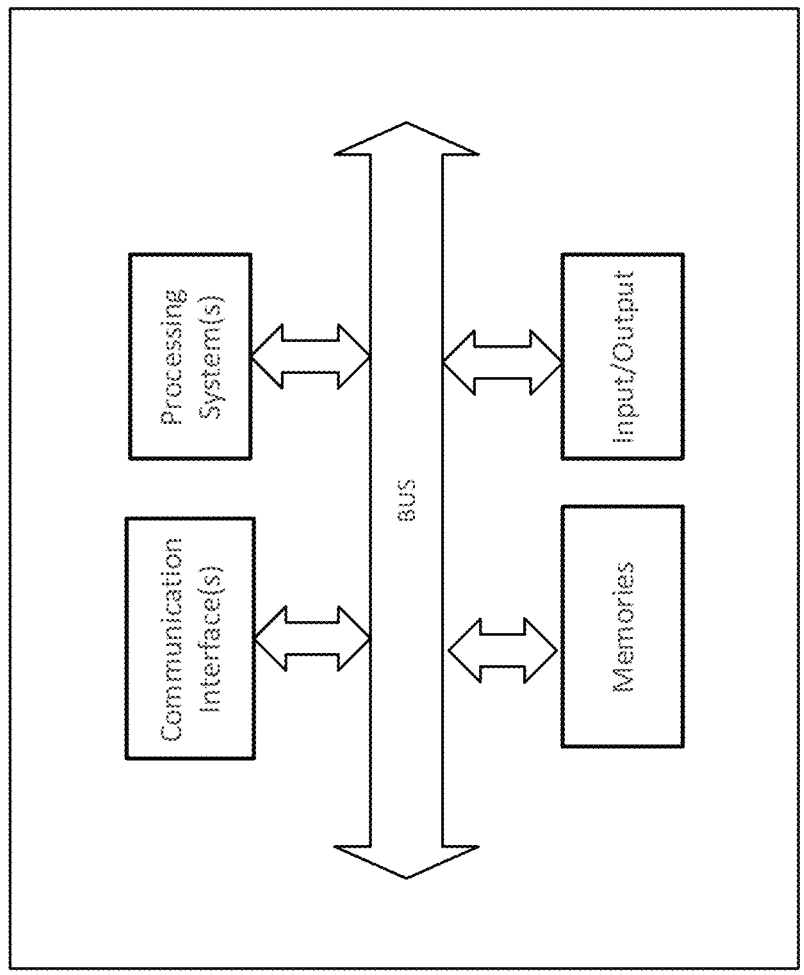
FIG. 24 illustrates an example of an implementation of one or more processing systems in accordance with an aspect of the present disclosure.

Various aspects of the present disclosure may also be implemented by one or more processing systems. For example, the host controller 101, field programmable device 103, or laser 109 may be implemented with a bus architecture, which may include a bus and any number of interconnecting buses and bridges, as shown in FIG. 24. The bus links together various circuits including one or more processing systems, one or more memories, one or more communication interfaces, and input/output devices. The one or more processing systems are responsible for managing the bus and general processing, including the execution of software stored on the non-transitory computer-readable medium. As noted, the one or more processing systems may include one or more reconfigurable circuit blocks that interpret and execute instructions. In the example implementations, the one or more processing systems may be implemented as or include one or more application specific integrated circuits, field programmable logic arrays, or the like. The software, when executed by the one or more processing systems, causes the one or more processing systems to perform the various functions described herein for any particular apparatus. The non-transitory computer-readable medium may also be used for storing data that is manipulated by the one or more processing systems when executing software. The one or more memories may include various types of memories including a random access memory or a read only memory, and/or other types of magnetic or optical recording medium and its corresponding derive for storing information and/or instructions. The one or more input/output devices may include devices that permit inputting information and/or outputting information to an external device or equipment. The one or more communication interfaces may also include any transceiver like mechanism that enables communication with other devices and/or systems, including optical transceivers (e.g., TOSA and/or ROSA).

Even though particular combinations of features are disclosed in the specification and/or recited in the claims, these combinations are not intended to limit the disclosure of the present technology. Further, the methods or methodologies for the present technology disclosed herein may be implemented in software, hardware, any combinations of software and hardware, a computer program or firmware incorporated in a computer readable medium for execution by a processing system that includes discrete hardware circuits, gated logic, state machines, programmable logic devices (PLDs), field programmable gate arrays (FPGAs), application specific integrated circuits (ASICs), and other suitable hardware configured to perform various functions described herein.

The term "software," "module," or "process" used herein is to be construed broadly to mean any instructions, instruction sets, programs, subprograms, code, program code, software modules, applications, software packages, routines, objects, executables, threads of execution, procedures, functions, etc. including firmware, microcode, middleware, software, hardware description language, or the like. Also, the software may include various types of machine instructions including instructions, code, programs, subprograms, software modules, applications, software packages, routines, subroutines, executables, procedures, functions, etc. Further, the software may also refer to general software, firmware, middleware, microcode, hardware description language, or etc. As noted above, the software may be stored on a computer-readable medium.

Examples of a computer-readable medium may include a non-transitory computer-readable medium, such as, by way of example, an optical disk, a magnetic storage device, a digital versatile disk, a flash memory, random access memory (RAM), static random access memory (SRAM), synchronous dynamic random access memory (SDRAM), read only memory (ROM), a register, programmable ROM (PROM), erasable PROM (EPROM), electrically erasable PROM (EEPROM), a removable disk, a flash memory device, and any other suitable medium for storing software that may be accessed and read by a processor or a processing system. It is also appreciated that one skilled in the art will recognize how best to implement the described functionality relating to various functions that are to be implemented in one or more field programmable device standalone or in combination with one or more computing systems, depending upon a particular application within design constraints.

The term "unit" or "component" used herein means software, hardware, or any combinations thereof. A component may be implemented as a software component, a hardware component, or any combinations thereof, including a field programmable gate array (FPGA), digital logic, digital logic arrays, application specific integrated circuit (ASIC), digital signal processor (DSP), etc. or any combinations thereof. The component thus may include software components, task components, processes, procedures, functions, program code, firmware, micro-codes, circuits, data structures, tables, arrays, and variables.

While for the purpose of simplicity the methodologies are described herein as a series of steps or acts, it is to be understood that the claimed subject matter is not limited by the order of steps or acts, as some steps or acts may occur in different orders and/or concurrently with other acts from that shown and described herein. Further, not all illustrated steps or acts may be required to implement various methodologies according to the present technology disclosed herein. Furthermore, the methodologies disclosed herein and throughout this specification are capable of being stored on an article of manufacture to facilitate transporting and transferring such methodologies to one or more processing systems. The term "article of manufacture" as used herein is intended to encompass a computer program accessible from any computer-readable device, carrier, or medium.

The terms "first," "second," and so forth used herein may be used to describe various components, but the components are not limited by the above terms. The above terms are used only to discriminate one component from the other component. For example, without departing from the scope of the present disclosure, a second component may be referred to as a first component, and the first component may be referred to as the second component in a similar manner. Also, the term "and/or" used herein includes a combination of a plurality of associated items or any item of the plurality of associated items.

Further, it is to be noted that when it is described that an element is "coupled" or "connected" to another element, the element may be directly coupled or directly connected to the other element, or the element may be coupled or connected to the other element through a third element. A singular form may include a plural form if there is no clearly opposite meaning in the context. In the present disclosure, the term "include" or "have" used herein indicates that a feature, an operation, a component, a step, a number, a part or any combination thereof described herein is present. However, the term "include" or "have" does not exclude a possibility of presence or addition of one or more other features, operations, components, steps, numbers, parts or combinations. Also, as used herein, the article "a" is intended to include one or more items. Further, no element, act, step, or instruction used in the present disclosure should be construed as critical or essential to the present disclosure unless explicitly described as such in the present disclosure.

Although the present technology has been illustrated with specific examples described herein for purposes of describing example embodiments, it is appreciated by one skilled in the relevant art that a wide variety of alternate and/or equivalent implementations may be substituted for the specific examples shown and described without departing from the scope of the present disclosure. As such, the present disclosure is intended to cover any adaptations or variations of the examples and/or embodiments shown and described herein, without departing from the spirit and the technical scope of the present disclosure.

What is claimed is:

1. An apparatus for controlling, monitoring, and/or communicating with an optical device, photonic integrated circuit or subassembly, the apparatus comprising:
    an optical device including a tunable laser having two mirrors; and
    a field programmable device including programmable hardware gates coupled to the optical device,
    wherein the field programmable device is configured to act as a control device for the apparatus and to implement a plurality of functions at a gate level for controlling, monitoring, and/or communicating with the optical device, each of the plurality of functions being configured to run as a concurrent process within the field programmable device;
    wherein the plurality of functions includes functions to obtain one or more gain-voltage maps by tuning laser mirror currents of the tunable laser at a temperature value; and
    wherein the plurality of functions further includes functions to determine lasing wavelengths corresponding to minima of the one or more gain-voltage maps, the lasing wavelengths being used for tuning or calibrating the tunable laser of the optical device.

2. The apparatus of claim 1, wherein the plurality of functions is configured to run at different clock signals in the field programmable device.

3. The apparatus of claim 1, wherein the minima of the one or more gain-voltage maps are determined as points of maximum power output of the tunable laser.

4. The apparatus of claim 1, wherein the field programmable device is configured to control one or more elements of the optical device which is selected from the group consisting of an optical data modulator/demodulator, internal or external optical and optoelectronic monitoring and control functions.

5. The apparatus of claim 4, wherein the field programmable device comprises one or more field programmable gate arrays (FPGAs) or programmable logic devices (PLDs).

6. The apparatus of claim 1, wherein the field programmable device is configured to automatically adapt laser control currents of the tunable laser to measure a temperature so as to reduce a load on a thermoelectric cooler (TEC), based on the measured temperature and at least one of: by moving between tables stored in the field programmable device or by extrapolating between temperature wavelength maps.

7. The apparatus of claim 1, wherein the field programmable device is configured to run one or more functions selected from the group consisting of:
    control and/or monitoring of a laser output power of the tunable laser;
    (ii) control and/or monitoring of temperature sensitive components in connection with the optical device;
    (iii) control and/or monitoring of a laser wavelength of the tunable laser;
    (iv) control of a wavelength locker function; and
    (v) control and/or monitoring of one or more communication interfaces coupled to a host.

8. The apparatus of claim 1, wherein the optical device comprises a communication interface which is integrated into the field programmable device, preferably wherein the programmable device comprises a field programmable gate array (FPGA).

9. The apparatus of claim 8, wherein the communication interface comprises one or more of sockets to a graphical user interface (GUI) or an application programming interface (API) that allows control, monitoring and/or communication with the tunable laser, an optical data modulator/demodulator, or other optical or optoelectronic elements which are monolithically integrated.

10. The apparatus of claim 9, wherein a software layer is used to interact with the tunable laser through the field programmable device to implement a fast wavelength calibration algorithm.

11. The apparatus of claim 1, wherein the field programmable device is configured to determine a temperature dependence of the mirror currents of the tunable laser based on the one or more gain-voltage maps, and to automatically adapt the laser mirror currents based on the one or more gain-voltage maps at different temperatures.

12. The apparatus of claim 1, wherein the plurality of functions includes a Pound-Drever-Hall (PDH) algorithm for reducing a linewidth and/or stabilizing a frequency of light from the tunable laser of the optical device.

13. The apparatus of claim 12, wherein the PDH algorithm is implemented in reprogrammable hardware gates of the field programmable device and some of the reprogrammable hardware gates are used for implementing a wavelength locking function.

14. The apparatus of claim 13, wherein the reprogrammable hardware gates of the field programmable device are configured to implement at least one of: host communications interfaces, a memory map, wavelength memory and management, programmable read-only memory (PROM) - serial peripheral interface (SPI) Flash interface to external erasable programmable read-only memory (EPROM), set currents and voltages to the optical device, monitoring of optical and electronic components, boxcar averagers, automatic power control, wavelength locking, linewidth narrowing algorithms, temperature monitoring and control, alarm generation, monitoring, control and communication of statuses, and application programmable interfaces.

15. The apparatus of claim 1, wherein the field programmable device is configured to receive one or more control signals from a graphical user interface (GUI) coupled to the apparatus via wireless communications or from a GUI of another apparatus located at a remote site over an optical communication link.

16. An optical communication system comprising:
    an optical device including a tunable laser integrated on a same substrate with an optical modulator and a semiconductor optical amplifier, non-integrated optical and optoelectronic elements; and
    a field programmable device including programmable hardware gates coupled to the optical device and a laser transmitter and receiver,
    wherein the field programmable device is configured to act as a control device for the optical communication system and to implement a plurality of functions at a gate level for controlling, monitoring, and/or communicating with the optical device, each of the plurality of functions being configured to run as a concurrent process, within the field programmable device;
    wherein the plurality of functions includes functions to obtain one or more gain-voltage maps based on laser mirror currents of the tunable laser at a temperature value; and
    wherein the plurality of functions further includes functions to determine lasing wavelengths corresponding to minima of the one or more gain-voltage maps, the lasing wavelengths being used for tuning or calibrating the tunable laser of the optical device.

17. The optical communication system of claim 16, wherein the field programmable device comprises one or more field programmable gate arrays (FPGAs) or programmable logic devices (PLDs).

18. The optical communication system of claim 17, wherein the field programmable device is configured to comprise application programmable interfaces (APIs) for real-time control and monitoring of the optical device based on actual traffic flows.

19. The optical communication system of claim 16, wherein the plurality of functions is configured to run at different clock signals in the field programmable device.

20. The optical communication system of claim 16, wherein the field programmable device comprises a communication interface including one or both of sockets to a graphical user interface (GUI) or an application programming interface (API) that allows control, monitoring and/or communication with the tunable laser integrated on the same substrate with the optical modulator and the semiconductor optical amplifier, non-integrated optical and optoelectronic elements.

* * * * *